(12) United States Patent
Sakane

(10) Patent No.: US 11,170,991 B2
(45) Date of Patent: Nov. 9, 2021

(54) PLASMA PROCESSING APPARATUS

(71) Applicant: TOKYO ELECTRON LIMITED, Tokyo (JP)

(72) Inventor: Ryota Sakane, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 682 days.

(21) Appl. No.: 15/891,501

(22) Filed: Feb. 8, 2018

(65) Prior Publication Data

US 2018/0226245 A1 Aug. 9, 2018

(30) Foreign Application Priority Data

Feb. 9, 2017 (JP) .............................. JP2017-022341

(51) Int. Cl.
| | |
|---|---|
| *H01L 21/3065* | (2006.01) |
| *H01L 21/02* | (2006.01) |
| *H01J 37/32* | (2006.01) |
| *H05H 1/46* | (2006.01) |

(52) U.S. Cl.
CPC .... *H01L 21/02252* (2013.01); *H01J 37/3244* (2013.01); *H01J 37/32082* (2013.01); *H01J 37/32091* (2013.01); *H01J 37/32183* (2013.01); *H01J 37/32348* (2013.01); *H01J 37/32568* (2013.01); *H05H 1/46* (2013.01)

(58) Field of Classification Search
None
See application file for complete search history.

(56) References Cited

U.S. PATENT DOCUMENTS

| | | | | |
|---|---|---|---|---|
| 6,427,621 | B1* | 8/2002 | Ikegawa | H01J 37/32266 118/723 MW |
| 7,682,483 | B2* | 3/2010 | Xia | H01J 37/32091 156/345.47 |
| 8,299,390 | B2 | 10/2012 | Dhindsa et al. | |
| 8,652,297 | B2* | 2/2014 | Collins | H01J 37/32091 156/345.44 |
| 9,245,776 | B2* | 1/2016 | Himori | H01L 21/67069 |
| 9,991,100 | B2* | 6/2018 | Sakane | H01J 37/32091 |
| 2005/0011453 | A1* | 1/2005 | Okumura | H01J 37/32623 118/723 E |
| 2007/0227666 | A1* | 10/2007 | Matsumoto | C23C 16/5096 156/345.47 |
| 2011/0226421 | A1* | 9/2011 | Hayashi | H01J 37/3255 156/345.44 |
| 2014/0020708 | A1* | 1/2014 | Kim | H01J 37/32568 134/1.1 |
| 2017/0213703 | A1* | 7/2017 | Sakane | H01J 37/32082 |

FOREIGN PATENT DOCUMENTS

JP 2009-164608 A 7/2009

* cited by examiner

*Primary Examiner* — Sylvia MacArthur
*Assistant Examiner* — Michelle Crowell
(74) *Attorney, Agent, or Firm* — Rothwell, Figg, Ernst & Manbeck, P.C.

(57) ABSTRACT

Disclosed is a plasma processing apparatus including: a first electrode to which a high frequency power is supplied; a second electrode that functions as a counter electrode with respect to the first electrode; a plurality of dielectric units arranged between plasma generated between the first electrode and the second electrode, and the second electrode; and a controller that controls an impedance between the plasma and the second electrode via each of the dielectric units by independently controlling a position or a dielectric constant of each of the dielectric units.

13 Claims, 19 Drawing Sheets

CIRCUMFERENCIAL DIRECTION

1

PLASMA PROCESSING APPARATUS

CROSS-REFERENCE TO RELATED APPLICATIONS

This application is based on and claims priority from Japanese Patent Application No. 2017-022341 filed on Feb. 9, 2017 with the Japan Patent Office, the disclosure of which is incorporated herein in its entirety by reference.

TECHNICAL FIELD

Various aspects and exemplary embodiments of the present disclosure relate to a plasma processing apparatus.

BACKGROUND

A semiconductor manufacturing process includes a process of performing a processing using plasma. In the processing process using plasma, the uniformity of the plasma generated in the processing apparatus is an important factor which affects the characteristics of the semiconductors to be manufactured. Therefore, in the processing process using plasma, it is required to control the distribution of the plasma with high accuracy. In order to reduce the bias of plasma generated in the processing apparatus, it is conceivable to design the space where the plasma is generated to have a symmetrical structure in the processing apparatus. However, even though the space where the plasma is generated is designed to have a symmetrical structure, the space in the processing apparatus may not become symmetrical due to, for example, errors in processing dimensions of components, variations in assembly, and consumption of components in many cases.

In order to prevent this, there has been known a technique for controlling the distribution of plasma in the radial direction by dividing an electrode for plasma generation into a central portion and a peripheral portion and controlling the impedance between the center portion and the ground and the impedance between the peripheral portion and the ground. In addition, there has been known a technique of providing a device for controlling the impedance between a feeding portion where high frequency power is supplied to an electrode and the ground around the feeding portion and controlling the distribution in the circumferential direction of the high frequency power applied to the electrode. See, e.g., U.S. Pat. No. 8,299,390, Japanese Patent Laid-Open Publication No. 2009-164608, and U.S. Pat. No. 8,652,297.

SUMMARY

According to an aspect of the present disclosure, there is provided a plasma processing apparatus including: a first electrode to which a high frequency power is supplied; a second electrode that functions as a counter electrode with respect to the first electrode; a plurality of dielectric units arranged between plasma generated between the first electrode and the second electrode, and the second electrode; and a controller that controls an impedance between the plasma and the second electrode via each of the dielectric units by independently controlling a position or a dielectric constant of each of the dielectric units.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
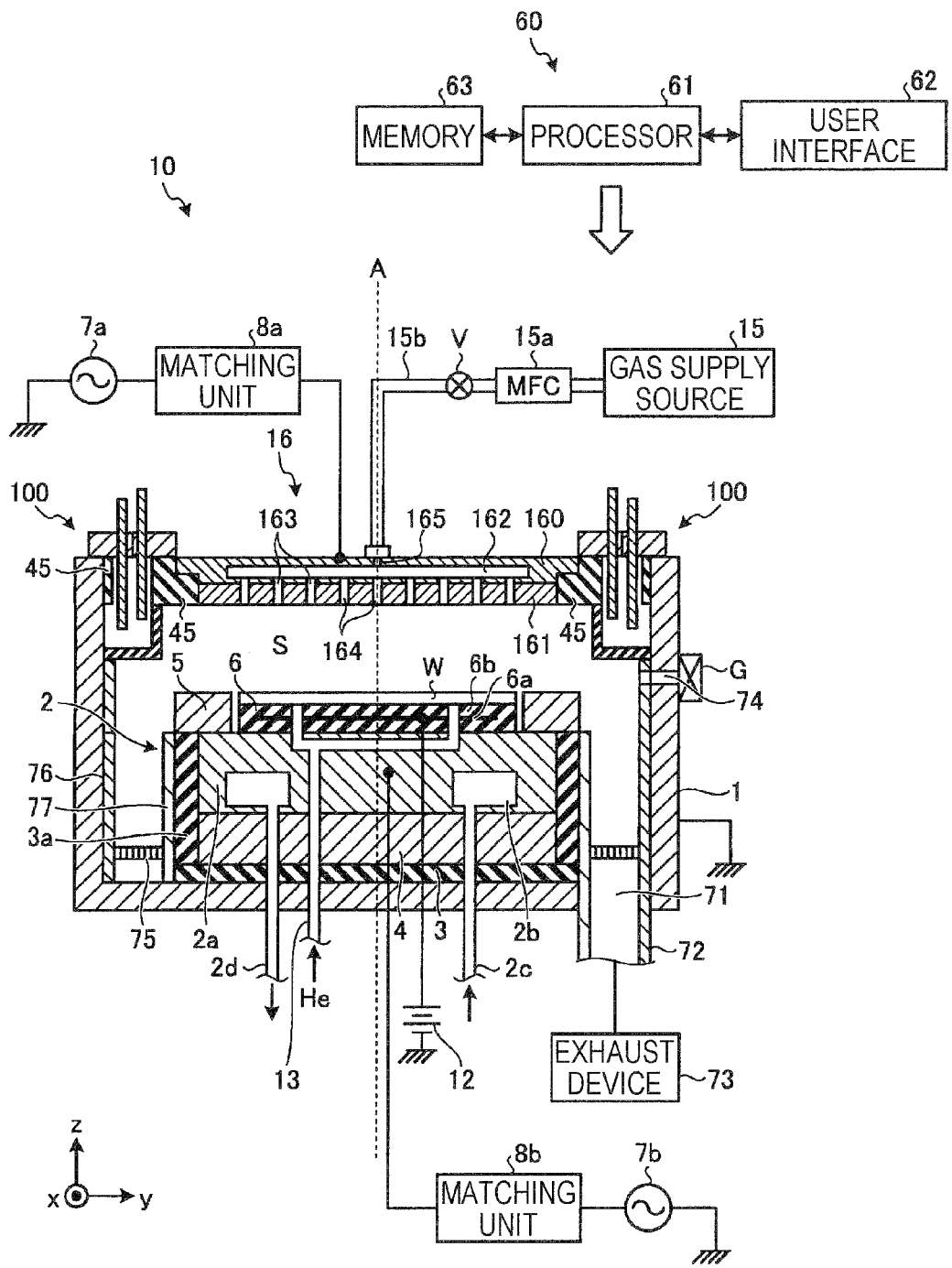
FIG. 1 is a cross-sectional view illustrating an example of a plasma processing apparatus in a first exemplary embodiment.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

There is no method for simultaneously controlling the distribution of the plasma generated in the processing apparatus in the radial direction and the circumferential direction. Therefore, it is required to simultaneously control the distribution of the plasma generated in the processing apparatus in the radial direction and the circumferential direction.

According to an aspect of the present disclosure, there is provided a plasma processing apparatus including: a first electrode to which a high frequency power is supplied; a second electrode that functions as a counter electrode with respect to the first electrode; a plurality of dielectric units arranged between plasma generated between the first electrode and the second electrode, and the second electrode; and a controller that controls an impedance between the plasma and the second electrode via each of the dielectric units by independently controlling a position or a dielectric constant of each of the dielectric units.

Further, in an exemplary embodiment of the above-described plasma processing apparatus, the controller may control the impedance between the plasma and the second electrode via each of the dielectric units by controlling a position of each of the dielectric units in a direction perpendicular to an electrode surface of the first electrode that faces the second electrode and/or a position of each of the dielectric units in a direction parallel to the electrode surface.

Further, in an exemplary embodiment of the above-described plasma processing apparatus, each of the dielectric units may be an at least partially plate-like dielectric, and may be arranged in a peripheral portion of the second electrode in a direction in which a thickness direction of the dielectric unit is an in-plane direction of an electrode surface of the first electrode that faces the second electrode.

Further, in an exemplary embodiment of the above-described plasma processing apparatus, each of the dielectric units may be an at least partially rod-like dielectric, and may be arranged in a peripheral portion of the second electrode in a direction in which a longitudinal direction of the dielectric unit is a direction perpendicular to an electrode surface of the first electrode that faces the second electrode.

Further, in an exemplary embodiment of the above-described plasma processing apparatus, the controller may control the dielectric constant of each of the dielectric units by controlling a temperature of each of the dielectric units.

Further, in an exemplary embodiment of the above-described plasma processing apparatus, each of the dielectric units may include a container to which at least one of a plurality of kinds of fluids having different dielectric constants is supplied, and the controller may control the dielectric constant of each of the dielectric units by controlling a ratio of the plurality of kinds of fluids supplied into the container of each of the dielectric units.

Further, in an exemplary embodiment of the above-described plasma processing apparatus, the dielectric units may be arranged in a central portion and a peripheral portion of the second electrode, and the controller may independently control the dielectric constant of each of the dielectric units.

According to various aspects and embodiments of the present disclosure, the uniformity of the plasma generated in the plasma processing apparatus may be improved.

Hereinafter, exemplary embodiments of the plasma processing apparatus disclosed herein will be described in detail with reference to the drawings. The plasma processing apparatus disclosed herein is not limited to the exemplary embodiments.

First Exemplary Embodiment

[Configuration of Plasma Processing Apparatus 10]

FIG. 1 is a cross-sectional view illustrating an example of a plasma processing apparatus 10 in a first exemplary embodiment. The plasma processing apparatus 10 of the present exemplary embodiment is, for example, a capacitively coupled parallel plate plasma etching apparatus. The plasma processing apparatus 10 includes, for example, a chamber 1 formed of aluminum of which the surface is anodized and having a substantially cylindrical space defined therein. The chamber 1 is grounded. The chamber 1 is disposed such that the central axis of the substantially cylindrical space defined by the inner wall of the chamber 1 coincides with an axis A illustrated in FIG. 1.

The chamber 1 includes therein a substantially cylindrical placing table 2 on which a semiconductor wafer W is placed. The placing table 2 includes a lower electrode 2a, a base 4, a focus ring 5, and an electrostatic chuck 6. The base 4 is formed of, for example, a ceramic and is disposed in the bottom portion of the chamber 1 via an insulating plate 3. The lower electrode 2a made of, for example, aluminum is provided on the base 4.

The electrostatic chuck 6 is provided on the upper surface of the lower electrode 2a to attract and hold the semiconductor wafer W by an electrostatic force. The electrostatic chuck 6 has a structure in which an electrode 6a formed of a conductive film is sandwiched between a pair of insulating layers 6b. The electrode 6a is electrically connected with a DC power supply 12. The semiconductor wafer W is placed on the upper surface of the electrostatic chuck 6 and attracted and held on the upper surface of the electrostatic chuck 6 by an electrostatic force generated on the surface of the electrostatic chuck 6 by the DC voltage supplied from the DC power supply 12.

On the upper surface of the lower electrode 2a, a conductive focus ring 5 formed of, for example, single crystal silicon is provided so as to surround the electrostatic chuck 6. The focus ring 5 makes it possible to improve the uniformity of the plasma processing (e.g., etching) on the surface of the semiconductor wafer W. The lateral surfaces of the lower electrode 2a and the base 4 are surrounded by a cylindrical inner wall member 3a formed of, for example, quartz.

For example, an annular coolant chamber 2b is formed inside the lower electrode 2a. A coolant (e.g., Galden (registered trademark)) is circulated and supplied from a chiller unit (not illustrated) provided outside to the coolant chamber 2b via a pipe 2c and a pipe 2d. The temperatures of the lower electrode 2a, the base 4, and the electrostatic chuck 6 are controlled by the coolant circulating in the coolant chamber 2b, and the semiconductor wafer W on the electrostatic chuck 6 is controlled to a predetermined temperature.

Further, a heat transfer gas (e.g., He gas) is supplied from a heat transfer gas supply mechanism (not illustrated) to a gap between the rear surface of the semiconductor wafer W placed on the electrostatic chuck 6 and the upper surface of the electrostatic chuck 6 via a pipe 13.

The lower electrode 2a is connected with a high frequency power supply 7b via a matching unit 8b. The high frequency power supply 7b supplies high frequency power of a predetermined frequency (e.g., 13 MHz) used for ion attraction (bias) to the lower electrode 2a. The matching unit 8b further has a function as a low-pass filter. As a result, the high frequency power, which has a frequency (e.g., 20 MHz or more) higher than a predetermined frequency used for ion attraction (bias) and flows from the plasma into the matching unit 8b via the lower electrode 2, flows to the safety ground. Therefore, the high frequency power is prevented from flowing into the high frequency power supply 7b.

An exhaust path 71 is provided around the placing table 2 so as to surround the placing table 2. A baffle plate 75 having a plurality of through-holes is provided in the exhaust path 71. The exhaust path 71 is connected with an exhaust device 73 via an exhaust port 72. The exhaust device 73 includes a vacuum pump such as, for example, a turbo molecular pump, and is capable of decompressing the inside of the processing container 1 to a desired degree of vacuum.

An opening 74 is provided in the side wall of the chamber 1, and a gate valve G is provided in the opening 74 so as to open and close the opening 74. In addition, a deposit shield 76 and a deposit shield 77 are detachably provided on the inner wall of the chamber 1 and the outer wall of the placing table 2, respectively. The deposit shield 76 and the deposit shield 77 suppress byproducts (deposits) from adhering to the inner wall of chamber 1.

An upper electrode 16 is provided above the lower electrode 2a so as to face the placing table 2. The lower electrode 2a and the upper electrode 16 are provided in the chamber 1 so as to be substantially parallel to each other. Hereinafter, the space between the semiconductor wafer W placed on the electrostatic chuck 6 and the lower surface of the upper electrode 16 is referred to as a processing space S.

The upper electrode 16 is supported in the upper portion of the chamber 1 via an insulating member 45. The upper electrode 16 includes a top plate supporting portion 160 and an upper top plate 161. The top plate supporting portion 160 is formed of, for example, aluminum of which the surface is anodized in a substantially disc shape, and detachably supports the upper top plate 161 in its lower portion. The upper top plate 161 is formed of, for example, a silicon-containing material such as, for example, Si, SiC, or quartz. The lower surface of the upper top plate 161 is an example of an electrode surface.

The top plate supporting portion 160 is connected with a high frequency power supply 7a via a matching unit 8a. The high frequency power supply 7a supplies high frequency power of a predetermined frequency (e.g., 60 MHz) used for plasma generation to the top plate supporting portion 160.

A gas diffusion chamber 162 is provided inside the top plate supporting portion 160. A plurality of gas flow ports 163 are formed in the bottom portion of the top plate supporting portion 160 so as to be positioned under the gas diffusion chamber 162. The plurality of gas flow ports 163 are formed concentrically around the axis A at substantially uniform intervals under the gas diffusion chamber 162.

A plurality of gas flow ports 164 is provided in the upper top plate 161 so as to penetrate the upper top plate 161 in the thickness direction. The plurality of gas flow ports 164 are formed concentrically around the axis A at substantially uniform intervals in the upper top plate 161. Each of the gas flow ports 164 communicates with one of the gas flow ports 163 described above. A processing gas supplied to the gas diffusion chamber 162 is diffused in a shower form and supplied into the chamber 1 via the plurality of gas flow ports 163 and 164. Further, the plurality of gas flow ports 163 and 164 are formed concentrically around the axis A at substantially uniform intervals. Therefore, the processing gas supplied into the chamber 1 via the plurality of gas flow ports 163 and 164 is supplied into the processing space S at a substantially uniform flow rate in the circumferential direction around the axis A.

A temperature adjusting mechanism (e.g., a heater (not illustrated) or a pipe (not illustrated) for circulating the coolant) is provided in the upper electrode 16, so that the temperature of the upper electrode 16 is controlled to a temperature within a desired range during the processing of the semiconductor wafer W. Further, when plasma is generated in the processing space S in the chamber 1, a negative DC voltage may be applied to the upper electrode 16 via a low-pass filter (LPF) as necessary.

The top plate supporting portion 160 of the upper electrode 16 is provided with a gas introduction port 165 that introduces a processing gas into the gas diffusion chamber 162. The gas introduction port 165 may be arranged such that the axis A passes via the center of the gas introduction port 165. One end of a pipe 15b is connected to the gas introducing port 165. The other end of the pipe 15b is connected to a gas supply source 15 that supplies a processing gas used for processing the semiconductor wafer W via a flow rate controller such as, for example, a valve V and a mass flow controller (MFC) 15a. The processing gas supplied from the gas supply source 15 is supplied into the gas diffusion chamber 162 via the pipe 15b, and diffused in a shower form and supplied into the chamber 1 via the plurality of gas flow ports 163 and 164.

Figure 2:
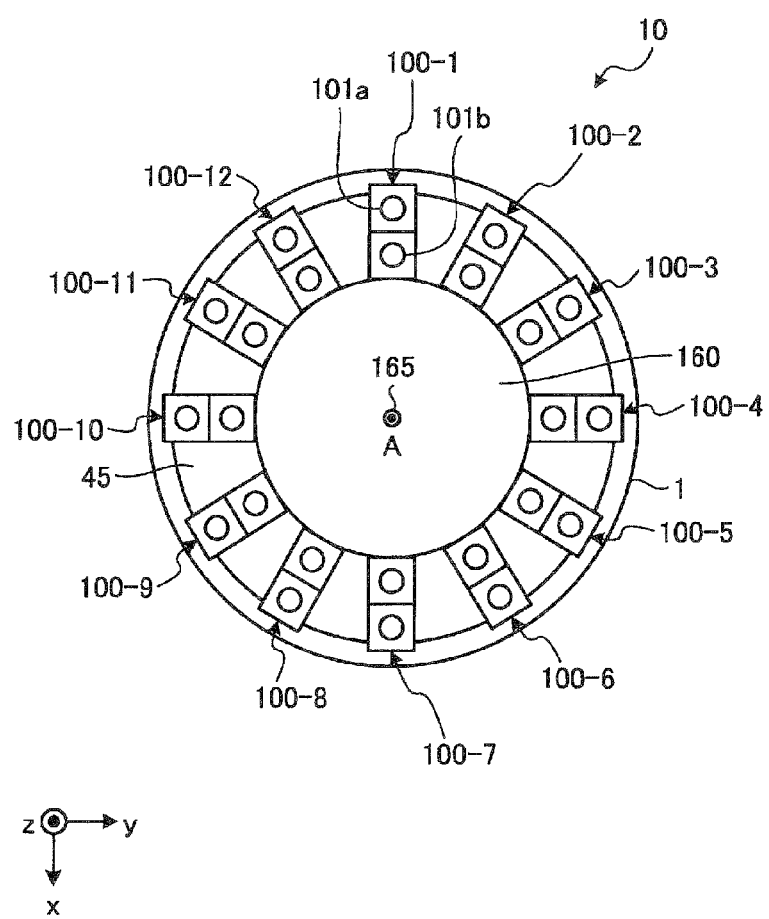
FIG. 2 is a top view illustrating an example of the plasma processing apparatus in the first exemplary embodiment.

Around and above the placing table 2, a plurality of distribution adjusting units 100 are arranged along the side wall of the chamber 1 so as to surround the processing space S. For example, as illustrated in FIG. 2, the plurality of distribution adjusting units 100 are arranged at substantially uniform intervals in a circular shape around the axis A, and control the distribution of the plasma generated in the processing space S. FIG. 2 is a top view illustrating an example of the plasma processing apparatus 10 in the first exemplary embodiment. In the present exemplary embodiment, twelve distribution adjusting units 100-1 to 100-12 are arranged in the chamber 1 so as to surround the processing space S. For example, as illustrated in FIG. 2, the number of the distribution adjusting units 100 may be less than 12 or more than 12, as long as they are arranged in a circular shape around the axis A. In the following description, the twelve distribution adjusting units 100-1 to 100-12 are simply referred to as distribution adjusting units 100 when they are generically referred to without distinguishing them.

Each of the distribution adjusting units 100 has two dielectric units 101a and 101b. In each of the distribution adjusting units 100 of the present exemplary embodiment, the dielectric unit 101b is disposed closer to the axis A than the dielectric unit 101a.

[Structure of Distribution Adjusting Unit 100]

Figure 3:
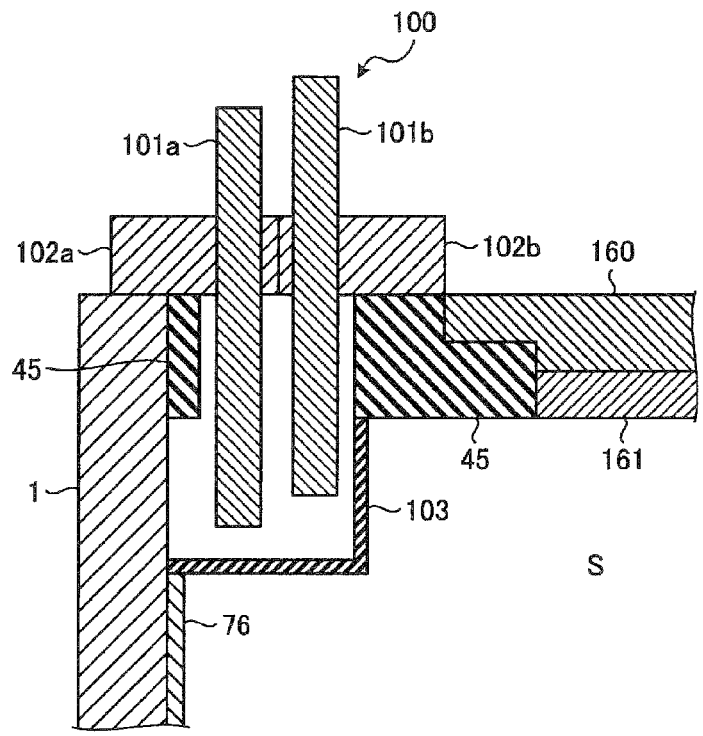
FIG. 3 is an enlarged cross-sectional view illustrating an example of a distribution adjusting unit in the first exemplary embodiment.
Figure 4:
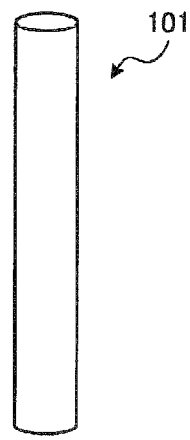
FIG. 4 is a perspective view illustrating an example of a dielectric unit in the first exemplary embodiment.

FIG. 3 is an enlarged cross-sectional view illustrating an example of the distribution adjusting unit 100 in the first exemplary embodiment. The distribution adjusting unit 100 in the present exemplary embodiment includes dielectric units 101a and 101b and actuators 102a and 102b. In the following description, the dielectric units 101a and 101b are simply referred to as dielectric units 101 when they are generically referred to without distinguishing them, and the actuators 102a and 102b are simply referred to as actuators 102 when they are generically referred to without distinguishing them. Each of the dielectric units 101 is inserted into a space positioned below the upper electrode 16 and surrounded by the chamber 1, the insulating member 45, and the insulating member 103, via a through-hole formed in the insulating member 45. Since the dielectric units 101 are surrounded by the insulating member 103, damage to the dielectric units 101 due to plasma may be suppressed. Thus, the dielectric units 101 may be formed of a material having low resistance to plasma. For example, as illustrated in FIG. 4, the dielectric units 101 in the present exemplary embodiment are formed of a dielectric in a substantially cylindrical rod shape.

The actuators 102 are, for example, air cylinders, and move the dielectric units 101 in the vertical direction along the axis A. The vertical direction is a direction perpendicular to the electrode surface which is the lower surface of the upper top plate 161 facing the lower electrode 2a. According to an instruction from the controller 60, the actuators 102 move the dielectric units 101 in the vertical direction along the axis A by a movement amount instructed by the controller 60.

When the actuators 102 move the dielectric units 101 in the vertical direction, the impedance between the plasma in the processing space S and the ground via the dielectric units 101 is changed. As a result, the distribution of the high frequency power in the processing space S is changed, so that the distribution of the plasma generated in the processing space S is changed. In each of the distribution adjusting units 100, the positions of the dielectric units 101a and 101b in the vertical direction may be independently controlled. Therefore, the plasma distribution is independently controlled between the processing space S and each of the distribution adjusting units 100. As a result, it is possible to control the distribution of the plasma generated in the processing space S in the processing space S in the circumferential direction and the radial direction of the circle around the axis A.

In the present exemplary embodiment, the upper electrode 16 functions as a cathode to which high frequency power for plasma generation is applied. Meanwhile, the lower electrode 2a and the side wall of the chamber 1 function as an anode which is a counter electrode to the upper electrode 16 with respect to the high frequency power for plasma generation. The upper electrode 16 is an example of the first electrode, and the lower electrode 2a and the side wall of the chamber 1 are examples of the second electrode.

The operation of the plasma processing apparatus 10 configured as described above is generally controlled by the controller 60. The controller 60 includes a processor 61 that has, for example, a central processing unit (CPU) and controls each unit of the plasma processing apparatus 10, a user interface 62, and a memory 63. The user interface 62 includes, for example, a keyboard for inputting commands by an operator to operate the plasma processing apparatus 10, and a display for visually displaying the operation status of the plasma processing apparatus 10.

The memory 63 stores a control program (software) for implementing various processings performed in the plasma processing apparatus 10 by the processor 61, or recipe in which, for example, a processing condition data is stored. The processor 61 reads the control program stored in the memory 63 and operates based on the read control program. Then, the processor 61 reads, for example, the recipe from the memory 63 according to, for example, an instruction received via the user interface 62 and controls the plasma processing apparatus 10 based on, for example, the read recipe. Therefore, a desired processing is performed by the plasma processing apparatus 10. In addition, the processor 61 is capable of reading, for example, the control program or the recipe stored in, for example, a computer-readable recording medium, from the recording medium, and executing the control program or the recipe. The computer readable recording medium is, for example, a hard disk, a digital versatile disk (DVD), a flexible disk, or a semiconductor memory. Further, the processor 61 is capable of acquiring a control program or recipe stored in a memory of another device, from the device via, for example, a communication line, and executing the control program or the recipe.

In the case where a processing using plasma is performed on the semiconductor wafer W in the plasma processing apparatus 10, the controller 60 performs, for example, the following control on the plasma processing apparatus 10. First, in a state where the semiconductor wafer W is placed on the electrostatic chuck 6, the controller 60 controls the valve V and the MFC 15a to supply a processing gas into the gas diffusion chamber 162 at a predetermined flow rate. The processing gas supplied to the gas diffusion chamber 162 is diffused in a shower form and supplied into the chamber 1 via the plurality of gas flow ports 163 and 164. Further, the controller 60 operates the exhaust device 73 to control the inside of the chamber 1 to a predetermined pressure.

Then, the controller 60 causes the high frequency power supply 7a to generate high frequency power of a predetermined frequency used for plasma generation and apply the high frequency power to the upper electrode 16, and causes the high frequency power supply 7b to generate high frequency power of a predetermined frequency used for ion attraction (bias) and apply to the lower electrode 2a. Therefore, plasma of the processing gas is generated in the processing space S between the semiconductor wafer W on the electrostatic chuck 6 and the upper electrode 16, and a bias potential for ion attraction is generated between the plasma and the semiconductor wafer W. Then, the controller 60 individually controls the insertion amount of the dielectric unit 101a and the dielectric unit 101b in each distribution adjusting unit 100, and controls the plasma distribution. Then, a predetermined processing (e.g., etching) is performed on the semiconductor wafer W on the electrostatic chuck 6 by ions and radicals contained in the plasma generated in the processing space S.

[Simulation Result]

Figure 5:
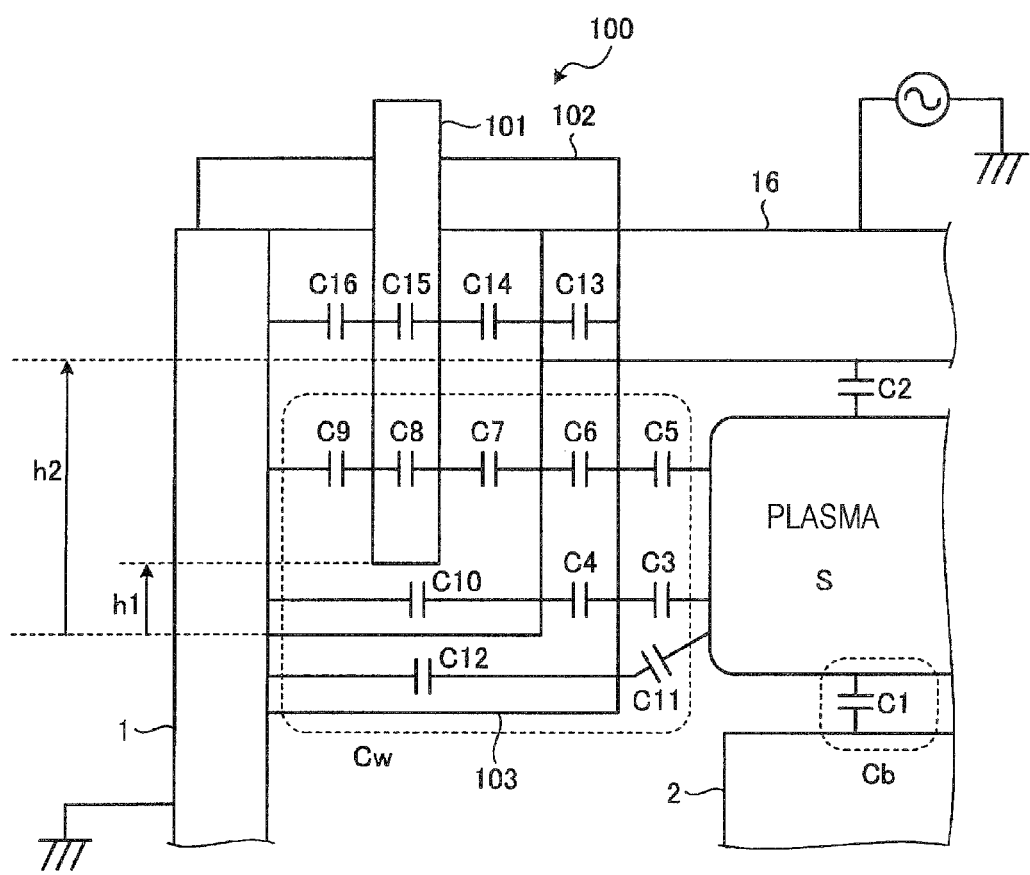
FIG. 5 is a view illustrating an example of an equivalent circuit in the vicinity of the distribution adjusting unit.

FIG. 5 is a view illustrating an example of an equivalent circuit in the vicinity of the distribution adjusting unit 100. In FIG. 5, for the sake of simplicity of descriptions, a distribution adjusting unit 100 having one dielectric unit 101 and one actuator 102 will be described as an example. In FIG. 5, the capacitance between the plasma generated in the processing space S and the placing table 2 is defined as Cb (C1), the capacitance between the plasma and the upper electrode 16 is defined as C2, the capacitance between the plasma and the side wall of the chamber 1 via the dielectric unit 101 is defined as Cw (C3 to C12), and the capacitance between the upper electrode 16 and the side wall of the chamber 1 via the dielectric unit 101 is defined as C13 to C16. When the position in the vertical direction of the dielectric unit 101 is changed, the capacitance Cw illustrated in FIG. 5 is changed. As a result, the impedance between the plasma in the processing space S and the ground is changed.

Here, for example, as illustrated in FIG. 5, the distance between the lower end of the dielectric unit 101 and the upper surface of the insulating member 103 is defined as h1, and the height from the upper surface of the insulating member 103 to the lower surface of the upper electrode 16 is defined as h2. The dielectric unit 101 moves in the vertical direction in a range of h1=0 to h2. When the dielectric unit 101 moves in the vertical direction, the capacitance ratio Cw/Cb is changed. As a result, the ratio of the high frequency power is also changed in the central portion and the peripheral portion of the processing space S. When the ratio of the high frequency power is changed in the central portion and the peripheral portion of the processing space S, the plasma distribution is also changed in the central portion and the peripheral portion of the processing space S. Therefore, the distribution of the plasma between the central portion and the peripheral portion of the processing space S may be controlled by controlling the insertion amount of the dielectric unit 101.

Figure 6:
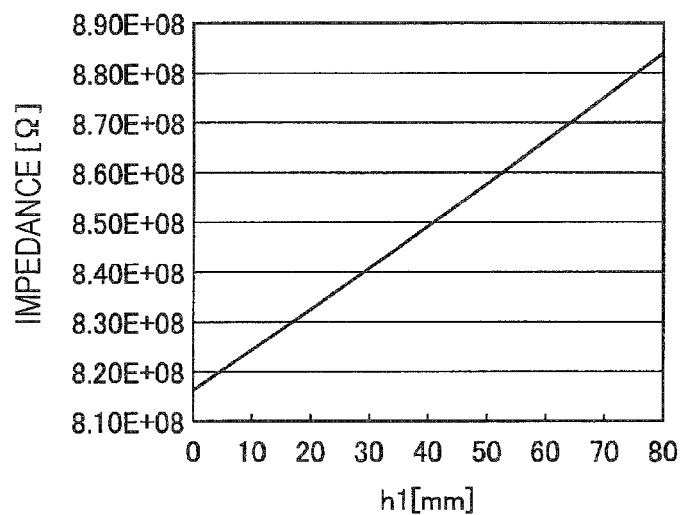
FIG. 6 is a graph illustrating an example of a change in impedance between the plasma and the side wall of the chamber with respect to the position of the dielectric unit.

Further, a change in impedance due to the capacitance Cw when the position of the dielectric unit 101 is changed was obtained by a simulation. FIG. 6 is a graph illustrating an example of a change in impedance between the plasma and the side wall of the chamber 1 with respect to the position of the dielectric unit 101. In FIG. 6, a simulation was performed using a high frequency power of 40 MHz as a high frequency power for plasma generation.

Referring to the simulation result of FIG. 6, it can be seen that the impedance between the plasma and the side wall of the chamber 1 increases as the insertion amount of the dielectric unit 101 decreases, that is, as h1 increases. This is because the capacitance Cw between the plasma and the side wall of the chamber 1 is reduced. Further, referring to the simulation result of FIG. 6, it can be seen that, when the insertion amount of the dielectric unit 101 is changed, a difference of about 8% in the impedance between the plasma and the side wall of the chamber 1 appears between the maximum (8.84Ω when h1=80 mm) and the minimum (8.17Ω when h1=0 mm). As apparent from the simulation result of FIG. 6, the distribution of the plasma in the processing space S in the circumferential direction may be controlled by independently controlling the insertion amount of each dielectric unit 101.

Figure 7:
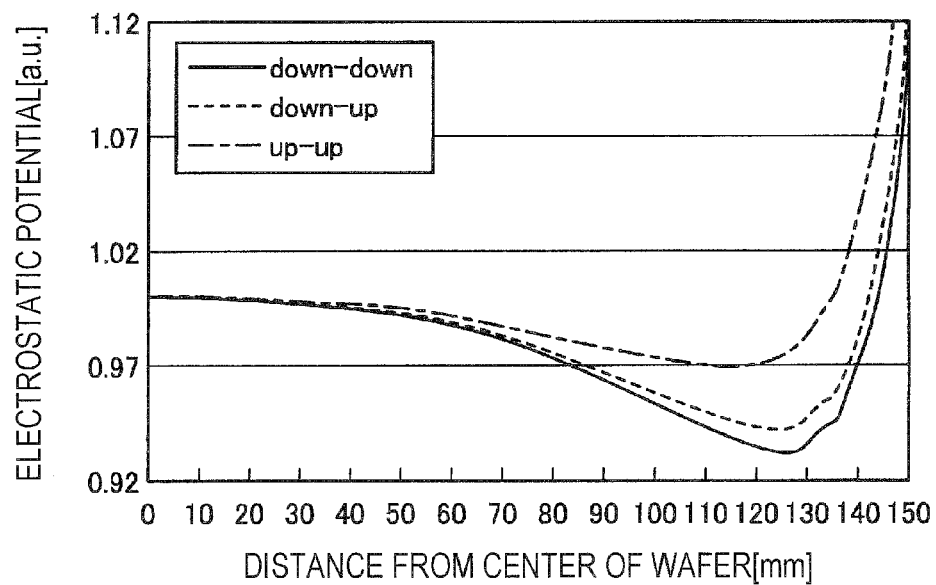
FIG. 7 is a graph illustrating an example of the distribution of the electrostatic potential.
Figure 8:
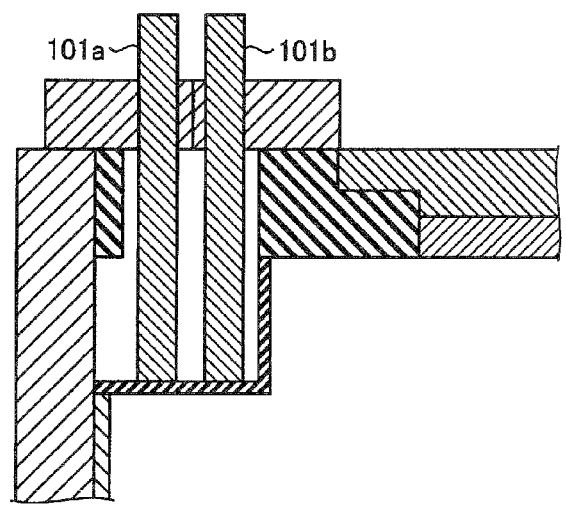
FIG. 8 is a view illustrating an example of the positions of the dielectric units.
Figure 9:
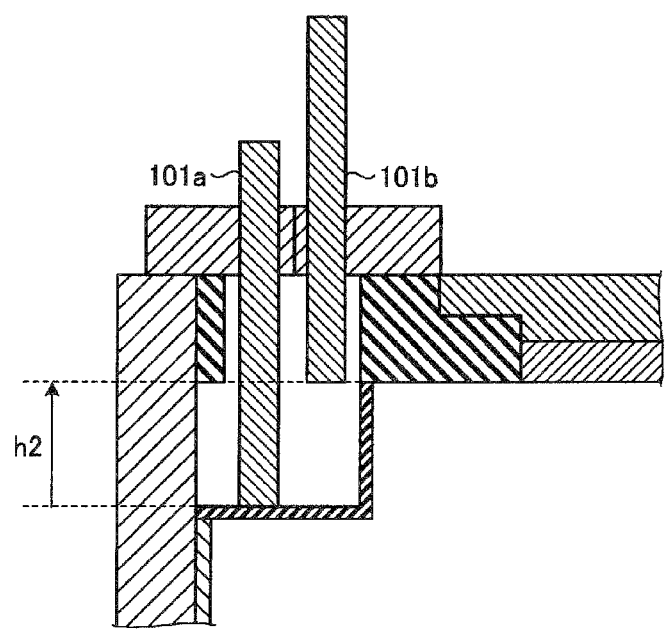
FIG. 9 is a view illustrating another example of the positions of the dielectric units.
Figure 10:
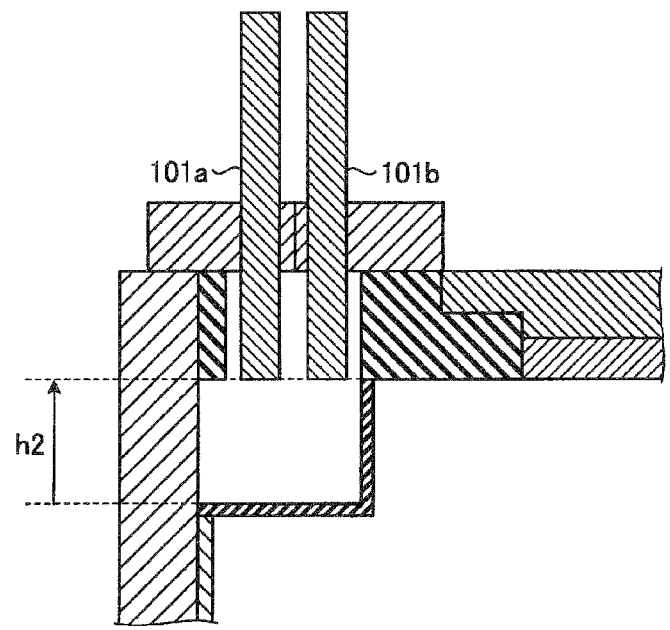
FIG. 10 is a view illustrating still another example of the positions of the dielectric units.

Next, a simulation was performed with respect to the distribution of the electrostatic potential in the processing space S. FIG. 7 is a graph illustrating an example of the distribution of the electrostatic potential. In the simulation result illustrated in FIG. 7, the positional relationship in the vertical direction of the dielectric unit 101a and the dielectric unit 101b in the distribution adjusting unit 100 was individually changed as illustrated in FIGS. 8 to 10. In the simulation result illustrated in FIG. 7, "down-down" indicates the distribution of the electrostatic potential when the dielectric unit 101a and the dielectric unit 101b are at the position illustrated in FIG. 8, that is, when the insertion amount of the dielectric unit 101a and the dielectric unit 101b are both are maximized, "down-up" indicates the distribution of the electrostatic potential when the dielectric unit 101a and the dielectric unit 101b are at the position illustrated in FIG. 9, that is, when the insertion amount of the dielectric unit 101a is maximized and the insertion amount of the dielectric unit 101b is minimized, and "up-up" indicates the distribution of the electrostatic potential when the dielectric unit 101a and the dielectric unit 101b are at the position illustrated in FIG. 10, that is, when the insertion amounts of the dielectric unit 101a and the dielectric unit 101b are both minimized. The value on the vertical axis in FIG. 7 is normalized by the electrostatic potential at the central position of the semiconductor wafer W (i.e., the position on the semiconductor wafer W through which the axis A passes). In the simulation result of FIG. 7, the distribution of the electrostatic potential at a position 10 mm above the semiconductor wafer W when a high frequency power is applied to the lower electrode 2a is illustrated.

Referring to FIG. 7, it can be seen that the distribution of the electrostatic potential is changed in both of the case where the insertion amounts of the dielectric unit 101a and the dielectric unit 101b are both maximized and the case where the insertion amounts are both minimized. Further, in the case where the insertion amount of the dielectric unit 101a is maximized and the insertion amount of the dielectric unit 101b is minimized, it can be seen that the distribution is between the case where the insertion amounts of the dielectric unit 101a and the dielectric unit 101b are both maximized and the case where the insertion amounts of the dielectric unit 101a and the dielectric unit 101b are both minimized.

Figure 11:
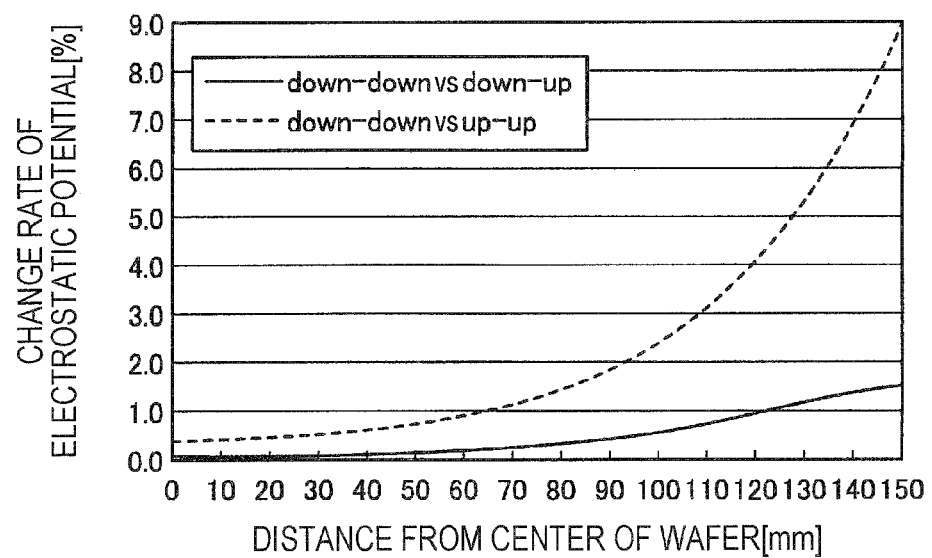
FIG. 11 is a graph illustrating an example of a change rate of the electrostatic potential.

FIG. 11 is a graph illustrating an example of a change rate of the electrostatic potential. Also in FIG. 11, it can be seen that the change amount of the electrostatic potential with respect to the insertion amount of the dielectric unit 101 is larger as it is closer to the edge of the semiconductor wafer W. From this result, it can be seen that when the high frequency power is applied to the upper electrode 16, the distribution of the plasma in the edge portion may be more effectively controlled in the plane of the semiconductor wafer W.

Figure 12:
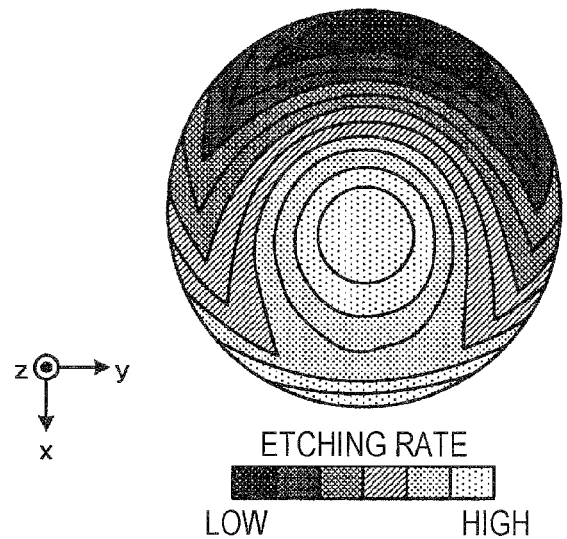
FIG. 12 is a view illustrating an example of bias in the etching rate.

Here, for example, as illustrated in FIG. 12, in the case where the etching rate of the semiconductor wafer W is biased toward the x direction (the lower side in FIG. 12) in the plane of the semiconductor wafer W, the dielectric unit 101 in the x direction when viewed from the center (axis A) of the semiconductor wafer W is controlled. For example, in the case where a plurality of distribution adjusting units 100 are arranged as illustrated in FIG. 2, the dielectric units 101 are pulled upward in the distribution adjusting units 100-6 to 100-8 in the x direction when viewed from the axis A. As a result, the impedance between the plasma and the ground increases and the high frequency power decreases in the direction from the axis A to the distribution adjusting units 100-6 to 100-8. Therefore, the plasma decreases in the direction from the axis A to the distribution adjusting units 100-6 to 100-8.

Further, for example, in the case where a plurality of distribution adjusting units 100 are arranged as illustrated in FIG. 2, the dielectric units 101 are pulled downward in the distribution adjusting units 100-12, 100-1, and 100-2 in a direction opposite to the x direction when viewed from the axis A. As a result, the impedance between the plasma and the ground decreases and the high frequency power increases in the direction from the axis A to the distribution adjusting units 100-12, 100-1, and 100-2. Therefore, the plasma increases in the direction from the axis A to the distribution adjusting units 100-12, 100-1, and 100-2.

Therefore, the plasma decreases in the x direction and the plasma increases in the direction opposite to the x direction.

As a result, the distribution of the plasma is biased in the direction opposite to the x direction, compared with the distribution when the distribution of the etching rate illustrated in FIG. 12 is formed. Therefore, for example, as illustrated in FIG. 13, bias in the etching rate is suppressed.

Figure 13:
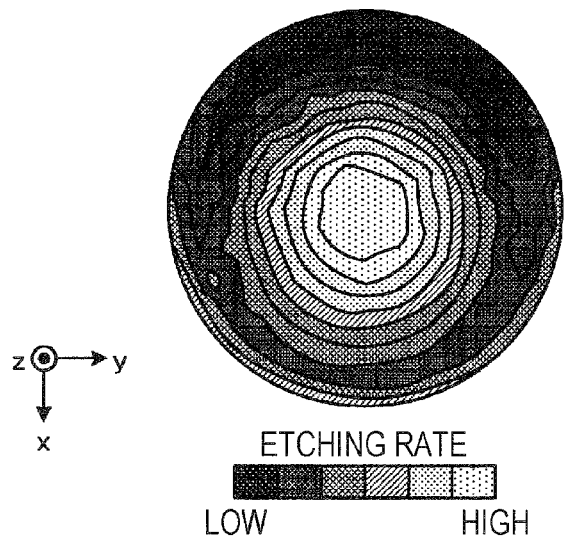
FIG. 13 is a view illustrating an example of the distribution of the etching rate in which bias is corrected by the distribution adjusting unit.

Further, in the insertion amounts of the dielectric unit 101*a* and the dielectric unit 101*b* in each distribution adjusting unit 100 which obtain the distribution of the etching rate illustrated in FIG. 13, the ratio between the etching rate in the vicinity of the center of the semiconductor wafer W and the etching rate in the vicinity of the edge may be changed by uniformly changing the insertion amounts of the dielectric units 101*a* and the dielectric units 101*b* in all the distribution adjusting units 100. As a result, the difference between the etching rate in the vicinity of the edge of the semiconductor wafer W and the etching rate in the vicinity of the center becomes small, so that the uniformity of the etching rate may be enhanced.

As apparent from the above description, according to the plasma processing apparatus 10 of the present exemplary embodiment, the distribution of the plasma in the circumferential direction and the radial direction of the wafer W may be simultaneously controlled by independently controlling the insertion amounts of the plurality of dielectric units 101 uniformly arranged in the circumferential direction of the semiconductor wafer W. Therefore, the uniformity of the plasma generated in the plasma processing apparatus 10 may be improved, and the uniformity of the processing on the semiconductor wafer W may be improved.

Second Exemplary Embodiment

Figure 14:
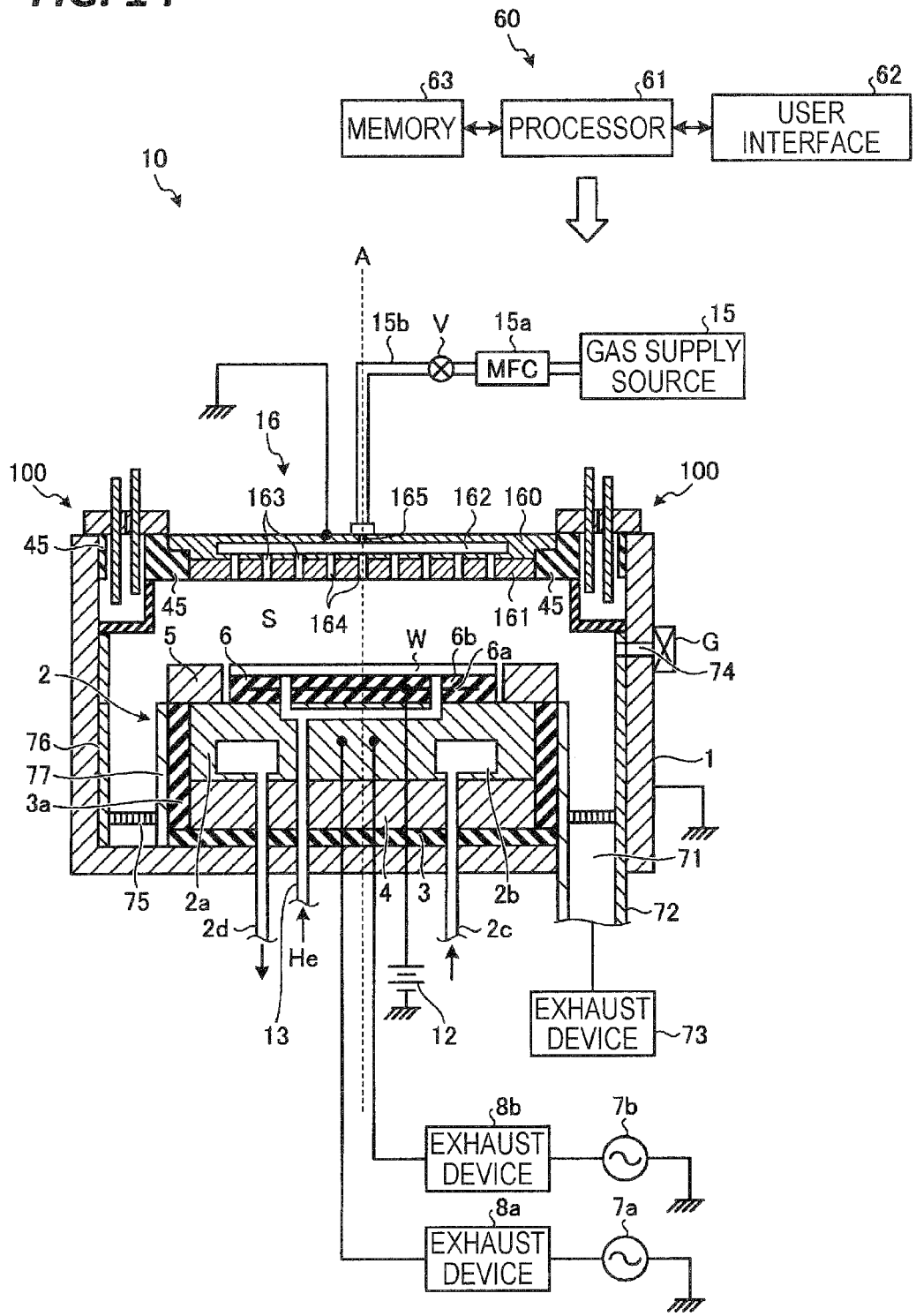
FIG. 14 is a cross-sectional view illustrating an example of a plasma processing apparatus in a second exemplary embodiment.

FIG. 14 is a cross-sectional view illustrating an example of a plasma processing apparatus 10 in a second exemplary embodiment. In the plasma processing apparatus 10 according to the first exemplary embodiment described above, the high frequency power for plasma generation generated by the high frequency power supply 7*a* was applied to the upper electrode 16 via the matching unit 8*a*. Meanwhile, in the plasma processing apparatus 10 of the present exemplary embodiment, for example, as illustrated in FIG. 14, the high frequency power for plasma generation generated by the high frequency power supply 7*a* is applied to the lower electrode 2*a* via the matching unit 8*a*. The top plate supporting portion 160 is grounded directly or via, for example, an element such as a capacitor, or an electric circuit. In other respects, the plasma processing apparatus 10 according to the present exemplary embodiment is the same as the plasma processing apparatus 10 of the first exemplary embodiment described with reference to FIG. 1. Thus, overlapping descriptions will be omitted.

In the present exemplary embodiment, the lower electrode 2*a* functions as a cathode to which high frequency power for plasma generation is applied. Meanwhile, the upper electrode 16 and the side wall of the chamber 1 function as an anode, which is a counter electrode to the lower electrode 2*a*, with respect to the high frequency power for plasma generation. In the present exemplary embodiment, the lower electrode 2*a* is an example of the first electrode, and the upper electrode 16 and the side wall of the chamber 1 are an example of the second electrode.

Figure 15:
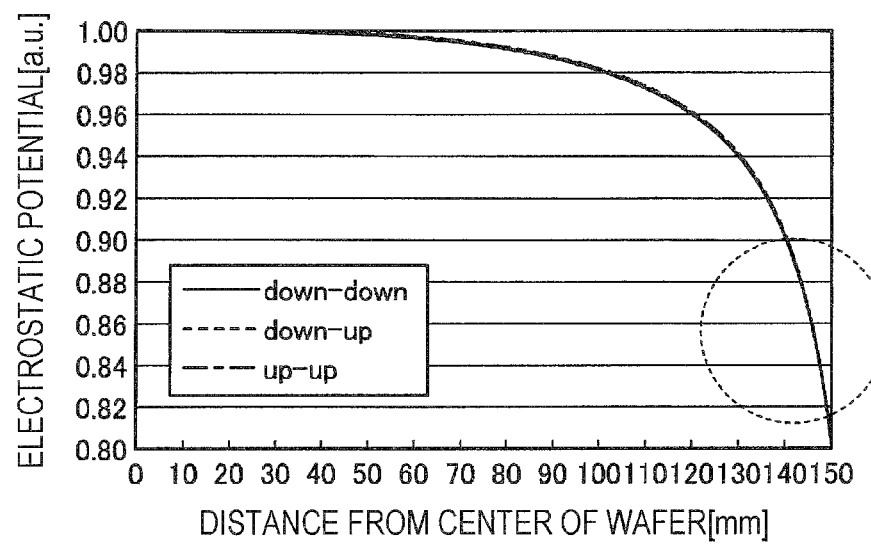
FIG. 15 is an enlarged view illustrating an example of the distribution of the electrostatic potential.
Figure 16:
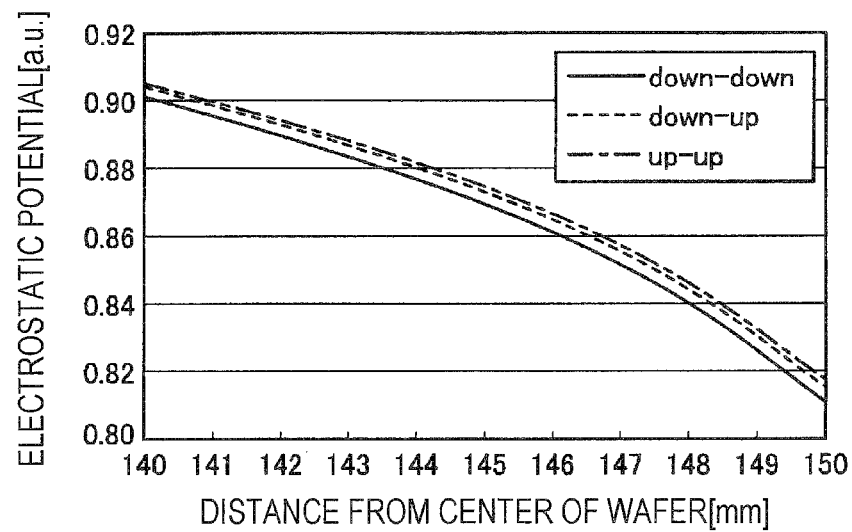
FIG. 16 is a graph illustrating an example of the distribution of the electrostatic potential.

Next, also in the present exemplary embodiment, a simulation was performed with respect to the distribution of the electrostatic potential in the processing space S. FIG. 15 is a graph illustrating an example of the distribution of the electrostatic potential. FIG. 16 is an enlarged view of the range of 140 mm to 150 mm apart from the center of the semiconductor wafer W in FIG. 15. Also in the simulation results illustrated in FIGS. 15 and 16, the positional relationship in the vertical direction of the dielectric unit 101*a* and the dielectric unit 101*b* in the distribution adjusting unit 100 was individually changed as illustrated in FIGS. 8 to 10.

Referring to FIGS. 15 and 16, also in the present exemplary embodiment, it can be seen that the distribution of the electrostatic potential is changed in the case where the insertion amounts of the dielectric unit 101*a* and the dielectric unit 101*b* are both maximized and in the case where the insertion amounts are both minimized. Further, in the case where the insertion amount of the dielectric unit 101*a* is maximized and the insertion amount of the dielectric unit 101*b* is minimized, it can be seen that the distribution is between the case where the insertion amounts of the dielectric unit 101*a* and the dielectric unit 101*b* are both maximized and the case where the insertion amounts of the dielectric unit 101*a* and the dielectric unit 101*b* are both minimized.

Figure 17:
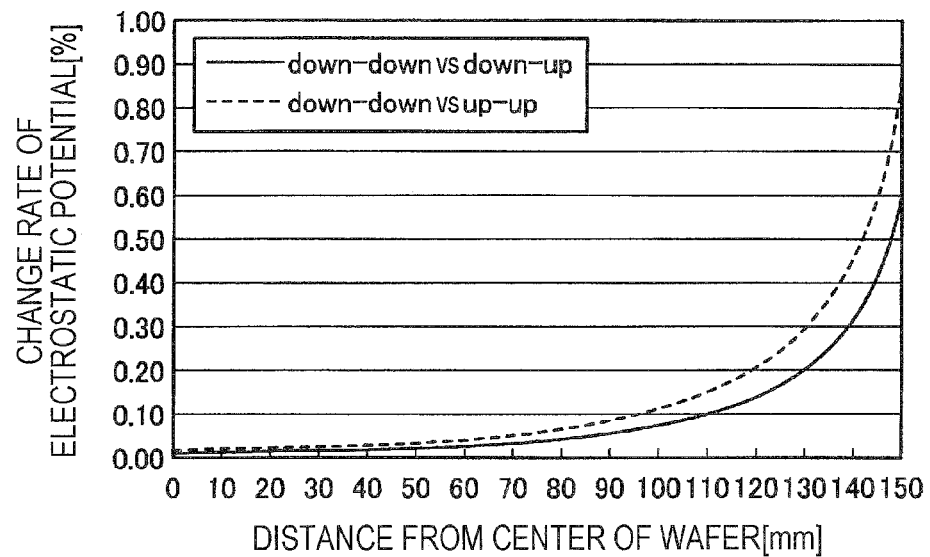
FIG. 17 is a graph illustrating an example of a change rate of the electrostatic potential.

FIG. 17 is a graph illustrating an example of a change rate of the electrostatic potential. Referring to FIG. 17, also in the present exemplary embodiment, it can be seen that the change amount of the electrostatic potential with respect to the insertion amount of the dielectric unit 101 is larger as it is closer to the edge of the semiconductor wafer W. From this result, also in the present exemplary embodiment, it can be seen that the distribution of the plasma in the edge portion may be more effectively controlled in the plane of the semiconductor wafer W.

Third Exemplary Embodiment

Figure 18:
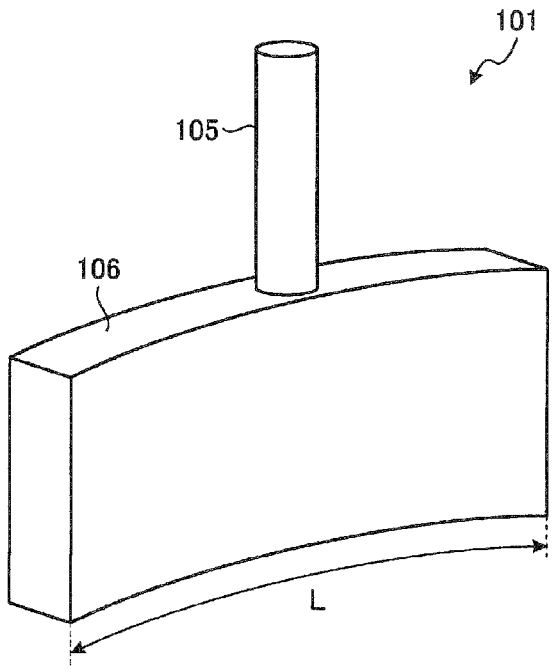
FIG. 18 is a perspective view illustrating an example of a dielectric unit in a third exemplary embodiment.

FIG. 18 is a perspective view illustrating an example of a dielectric unit 101 in a third exemplary embodiment. The dielectric unit 101 of the first exemplary embodiment described above is formed in a shape of a substantially cylindrical rod, whereas the dielectric unit 101 of the present exemplary embodiment has a support portion 105 and a plate portion 106, for example, as illustrated in FIG. 18. The plate portion 106 is formed of a dielectric in a plate shape. The support portion 105 may be formed of a dielectric or may be formed of a metal. The plate portion 106 is curved in a shape along the side wall of the substantially cylindrical chamber 1. The width L of the plate portion 106 in the circumferential direction of a circle around the axis A is a length obtained by removing a distance of the gap defined between the plate portion 106 and a plate portion 106 of an adjacent distribution adjusting portion 100 from a length obtained by equally dividing a circle whose radius is a distance from the axis A to the position where the dielectric unit 101 is arranged, by the number of the distribution adjusting units 100. The gap defined between the plate portions 106 and a plate portion 106 of an adjacent distribution adjusting portion 100 may be as narrow as possible. The dielectric unit 101 is arranged along the side wall of the chamber 1 such that the thickness direction of the plate portion 106 faces the radial direction of the circle around the axis A. The plate portion 106 may be a flat plate shape that is not curved.

In this manner, at least a part of the dielectric unit 101 is formed of a plate-like dielectric, so that the amount of change in the impedance between the plasma in the processing space S and the ground may be increased with respect to the amount of change in the position of the dielectric unit 101.

Fourth Exemplary Embodiment

Figure 19:
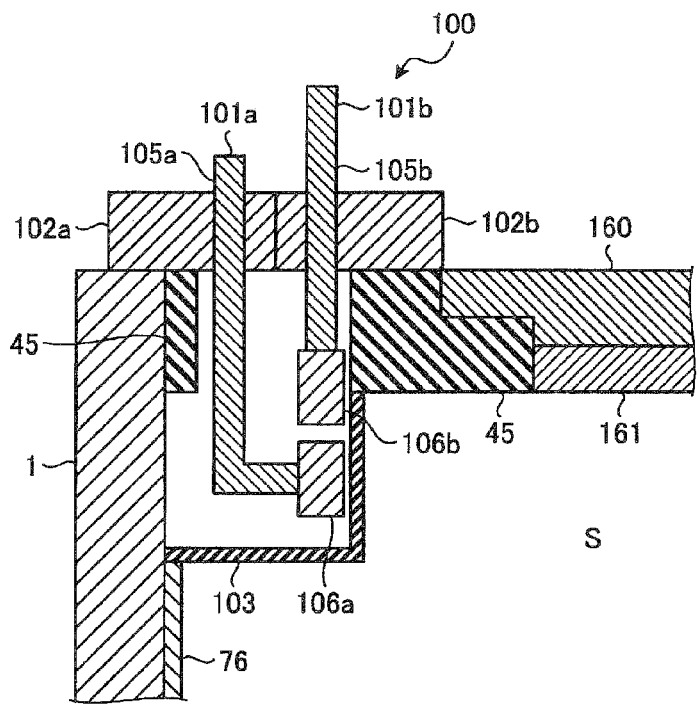
FIG. 19 is an enlarged cross-sectional view illustrating an example of a distribution adjusting unit in a fourth exemplary embodiment.

For example, as illustrated in FIG. 19, the dielectric units 101 in a fourth exemplary embodiment are arranged such that a plate portion 106a and a plate portion 106b overlap each other in the vertical direction. FIG. 19 is an enlarged cross-sectional view illustrating an example of the distribution adjusting unit 100 in the fourth exemplary embodiment.

Figure 20:
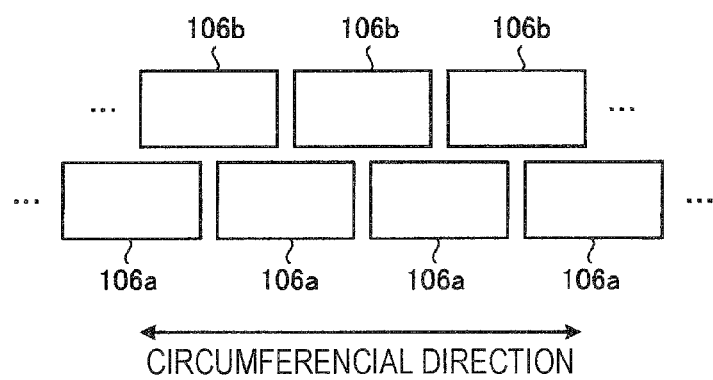
FIG. 20 is a schematic view illustrating an example of the arrangement of the plate portions of the dielectric units.

For example, as illustrated in FIG. 20, the plate portions 106 of the respective distribution adjusting units 100 may be arranged such that the gap between adjacent plate portions 106a in the circumferential direction and the gap between adjacent plate portions 106b in the circumferential direction are defined at different positions in the circumferential direction. Therefore, it is possible to reduce the influence of the gap between adjacent plate portions 106a in the circumferential direction and the gap between adjacent plate portions 106b in the circumferential direction with respect to the plasma generated in the processing space S.

Fifth Exemplary Embodiment

Figure 21:
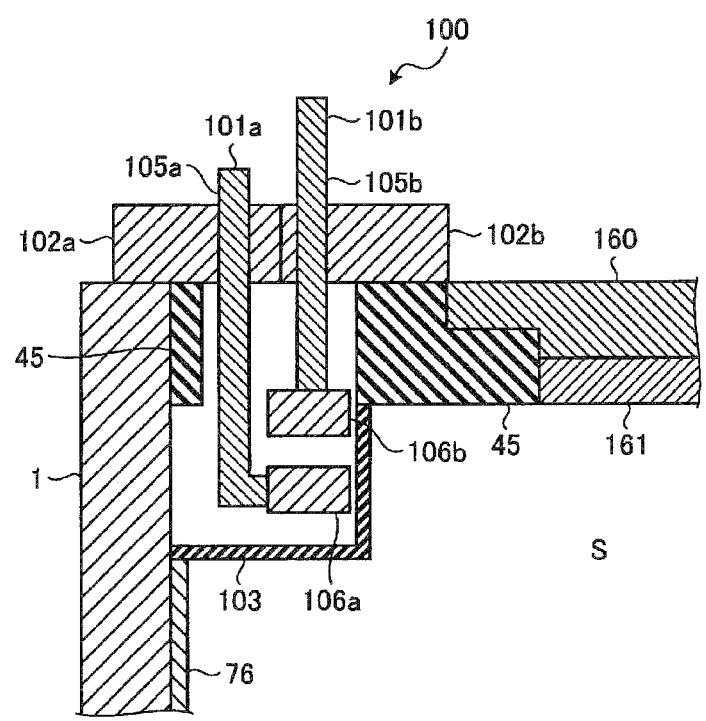
FIG. 21 is an enlarged cross-sectional view illustrating an example of a distribution adjusting unit in a fifth exemplary embodiment.

Further, for example, as illustrated in FIG. 21, in each distribution adjusting unit 100, the plate portion 106a and the plate portion 106b may be arranged such that the thickness direction is directed in the vertical direction. FIG. 21 is an enlarged cross-sectional view illustrating an example of the distribution adjusting unit 100 in the fifth exemplary embodiment.

Sixth Exemplary Embodiment

In the first to fifth exemplary embodiments described above, the impedance between the plasma in the processing space S and the ground is changed by changing the positions of the dielectric units 101. Meanwhile, in the present exemplary embodiment, the impedance between the plasma in the processing space S and the ground is changed by changing the dielectric constants of the dielectric units 101 themselves.

Figure 22:
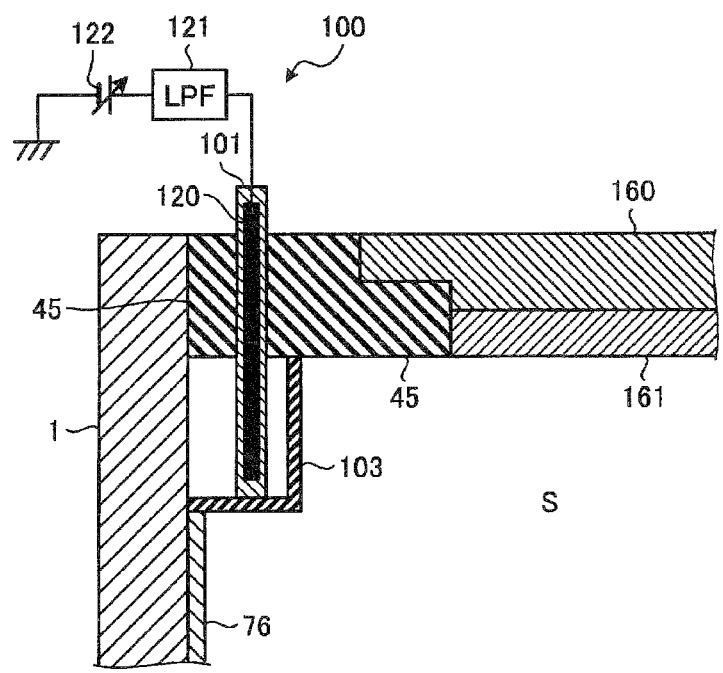
FIG. 22 is an enlarged cross-sectional view illustrating an example of a distribution adjusting unit in a sixth exemplary embodiment.

FIG. 22 is an enlarged cross-sectional view illustrating an example of the distribution adjusting unit 100 in the sixth exemplary embodiment. The distribution adjusting unit 100 in the present exemplary embodiment has a dielectric unit 101 formed of a dielectric in a rod-like or plate-like shape and having a heater 120 embedded therein. The heater 120 embedded in the dielectric unit 101 is connected to a variable DC power supply 122 via an LPF 121. The LPF 121 shuts off the high frequency power flowing from the plasma to the variable DC power supply 122 via the dielectric unit 101. The variable DC power supply 122 supplies a DC voltage or a DC current to the heater 120 via the LPF 121. The DC voltage or the DC current supplied to the heater 120 by the variable DC power supply 122 is controlled by the controller 60. In the case where a material having resistance to plasma (e.g., alumina or quartz) is used as a dielectric of the dielectric unit 101, the insulating member 103 may not be provided. Further, in the present exemplary embodiment, the variable DC power supply 122 is used as the power supply for the heater 120, but a variable AC power supply may be used as the power supply for the heater 120.

The heater 120 generates heat according to the magnitude of the voltage or current supplied from the variable DC power supply 122 via the LPF 121, and heats the dielectric unit 101. The temperature of the dielectric unit 101 is changed by heating by the heater 120. When the temperature of the dielectric unit 101 is changed, the dielectric constant of the dielectric unit 101 is changed. Thus, the impedance between the plasma in the processing space S and the ground may be changed. Further, in order to control the temperature of the heated dielectric unit 101 to a constant value, a sensor for temperature measurement (not illustrated) may be attached to the dielectric unit 101, and the controller 60 may control the electric power supplied to the heater 120, based on the temperature data measured by the sensor.

Seventh Exemplary Embodiment

Figure 23:
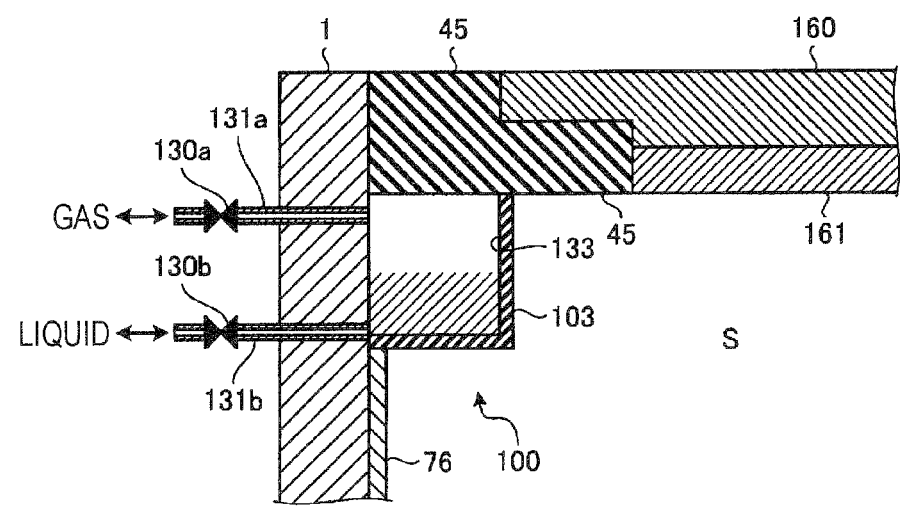
FIG. 23 is an enlarged cross-sectional view illustrating an example of a distribution adjusting unit in a seventh exemplary embodiment.

In a seventh exemplary embodiment, the dielectric constant of the dielectric unit is changed by controlling the ratio of a plurality of types of fluids having different dielectric constants supplied into the dielectric unit. FIG. 23 is an enlarged cross-sectional view illustrating an example of the distribution adjusting unit 100 in the seventh exemplary embodiment. The distribution adjusting unit 100 in the present exemplary embodiment includes a valve 130a, a valve 130b, a pipe 131a, and a pipe 131b. The pipe 131a and the pipe 131b communicate with the container 133 constituting the space surrounded by the chamber 1, the insulating member 45, and the insulating member 103, via the chamber 1. Further, the pipe 131a is connected to a gas adjusting unit that supplies a gas into the container 133 via the valve 130a and sucks the gas from the container 133. Further, the pipe 131b is connected to a liquid adjusting unit that supplies a liquid into the container 133 via the valve 130b and sucks the liquid from the container 133. The operation of the gas adjusting unit and the liquid adjusting unit is controlled by the controller 60, and the position of the interface between the gas and the liquid supplied into the container 133 is adjusted. That is, the ratios of a plurality of types of fluids are controlled by the controller 60. The container 133 is an example of the dielectric unit.

In the present exemplary embodiment, the gas supplied into the container 133 is, for example, dry air, and the liquid supplied into the container 133 is, for example, an organic solvent (e.g., Galden). The dielectric constant of the dry air is much smaller than the dielectric constant of the organic solvent. Therefore, the dielectric constant of the entire substance supplied into the container 133 may be changed by controlling the ratio of the dry air and the organic solvent supplied into the container 133. The dry air and the organic solvent are examples of the plurality of types of fluids having different dielectric constants.

Eighth Exemplary Embodiment

In the seventh exemplary embodiment, one container 133 is provided in each distribution adjusting unit 100, and ratios of a plurality of types of fluids having different dielectric constants supplied to the container 133 are controlled. Meanwhile, in the present exemplary embodiment, a plurality of types of fluids having different dielectric constants are supplied into a plurality of containers 133a and 133b arranged in the radial direction of the semiconductor wafer W in each distribution adjusting unit 100, and the dielectric constants of the containers 133a and 133b are independently controlled.

Figure 24:
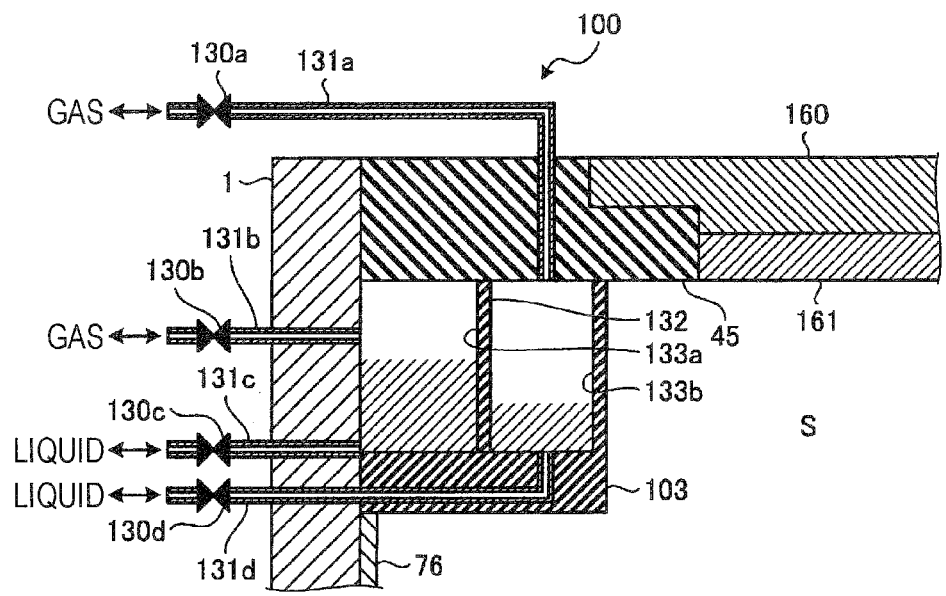
FIG. 24 is an enlarged cross-sectional view illustrating an example of a distribution adjusting unit in an eighth exemplary embodiment.

FIG. 24 is an enlarged cross-sectional view illustrating an example of the distribution adjusting unit 100 in the eighth exemplary embodiment. The distribution adjusting unit 100 in the present exemplary embodiment includes valves 130a to 130d and pipes 131a to 131d. The space surrounded by the chamber 1, the insulating member 45, and the insulating member 103 is divided into the container 133a and the container 133b in the radial direction of the semiconductor wafer W by a partition 132. The pipe 131a communicates with the space inside the container 133b surrounded by the insulating member 45, the insulating member 103, and the partition 132 via the insulating member 45. In addition, the pipe 131d communicates with the space inside the container 133b via the chamber 1 and the insulating member 103. The pipe 131b and the pipe 131c communicate with the space inside the container 133a surrounded by the chamber 1, the insulating member 45, the insulating member 103, and the partition 132 via the chamber 1.

Further, the pipe 131a is connected to a gas adjusting unit that supplies a gas into the container 133b via the valve 130a and sucks the gas from the container 133b. Further, the pipe 131b is connected to a gas adjusting unit that supplies a gas into the container 133a via the valve 130b and sucks the gas from the container 133a. Further, the pipe 131c is connected to a liquid adjusting unit that supplies a liquid into the container 133a via the valve 130c and sucks the liquid from the container 133a. Further, the pipe 131d is connected to a liquid adjusting unit that supplies a liquid into the container 133b via the valve 130d and sucks the liquid from the container 133b.

Ninth Exemplary Embodiment

In the eighth exemplary embodiment, a plurality of types of fluids having different dielectric constants are supplied into a plurality of containers 133a and 133b arranged in the radial direction of the semiconductor wafer W in each distribution adjusting unit 100. Meanwhile, in the present exemplary embodiment, a plurality of types of fluids having different dielectric constants are supplied into a plurality of containers 133a and 133b arranged in the vertical direction in each distribution adjusting unit 100, and the dielectric constants of the containers 133a and 133b are independently controlled.

Figure 25:
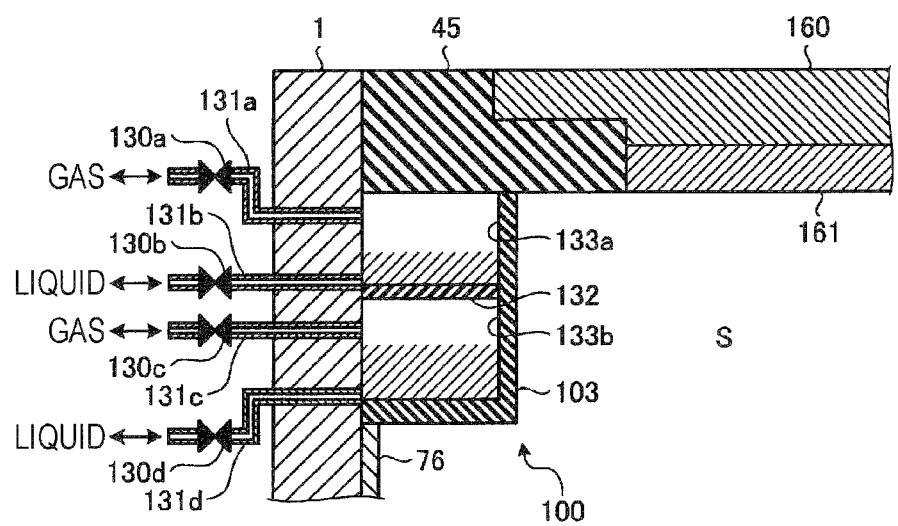
FIG. 25 is an enlarged cross-sectional view illustrating an example of a distribution adjusting unit in a ninth exemplary embodiment.

FIG. 25 is an enlarged cross-sectional view illustrating an example of the distribution adjusting unit 100 in the ninth exemplary embodiment. The distribution adjusting unit 100 in the present embodiment includes valves 130a to 130d and pipes 131a to 131d. The space surrounded by the chamber 1, the insulating member 45, and the insulating member 103 is divided into the container 133a and the container 133b vertically by a partition 132. The pipe 131a and the pipe 131b communicate with the space inside the container 133a surrounded by the chamber 1, the insulating member 45, the insulating member 103, and the partition 132 via the chamber 1. The pipe 131c and the pipe 131d communicate with the space inside the container 133b surrounded by the chamber 1, the insulating member 103, and the partition 132 via the chamber 1.

Further, the pipe 131a is connected to a gas adjusting unit that supplies a gas into the container 133a via the valve 130a and sucks the gas from the container 133a. Further, the pipe 131b is connected to a liquid adjusting unit that supplies a liquid into the container 133a via the valve 130b and sucks the liquid from the container 133a. Further, the pipe 131c is connected to a gas adjusting unit that supplies a gas into the container 133b via the valve 130c and sucks the gas from the container 133b. Further, the pipe 131d is connected to a liquid adjusting unit that supplies a liquid into the container 133b via the valve 130d and sucks the liquid from the container 133b.

In the eighth and ninth exemplary embodiments, two containers 133a and 133b are arranged in the radial direction or the vertical direction of the semiconductor wafer W, but three or more containers 133 may be provided in the radial direction or the vertical direction of the semiconductor wafer W.

Tenth Exemplary Embodiment

In the first to ninth exemplary embodiments described above, the impedance between the plasma and the ground in the circumferential direction was controlled by the plurality of distribution adjusting units 100 provided around the processing space S. Meanwhile, in the tenth exemplary embodiment, the upper electrode 16 is divided into a central portion and a peripheral portion, and the peripheral portion is further divided into a plurality of portions in the circumferential direction. Thus, the present exemplary embodiment is different from the first to ninth exemplary embodiments in that the impedance between the plasma and ground in the circumferential direction is controlled by disposing respective distribution adjusting units 100 between the divided upper electrodes 16 and the processing space S and controlling the impedance between the plasma and the upper electrodes 16 via the distribution adjusting units 100.

Figure 26:
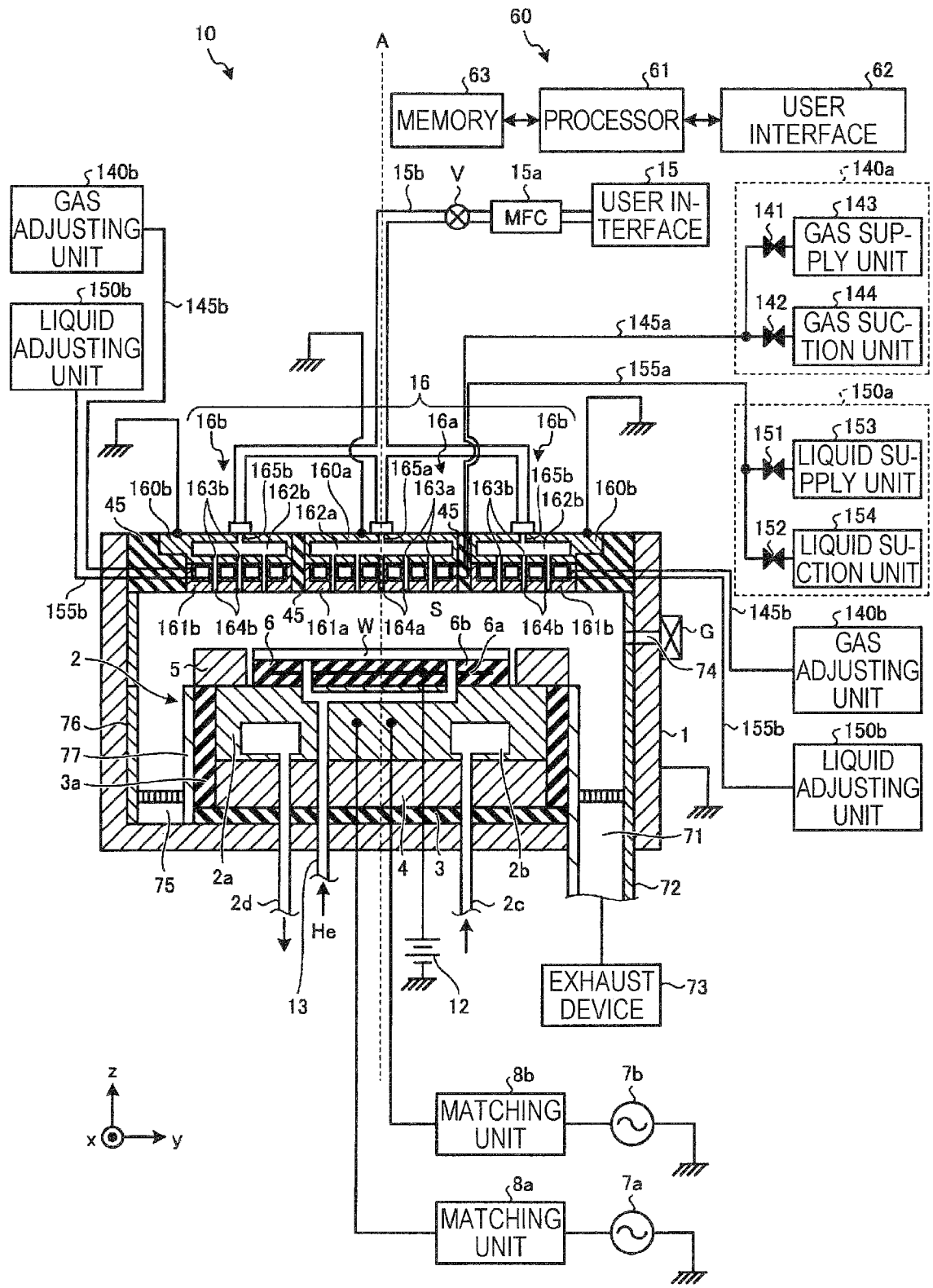
FIG. 26 is a cross-sectional view illustrating an example of a plasma processing apparatus in a tenth exemplary embodiment.
Figure 27:
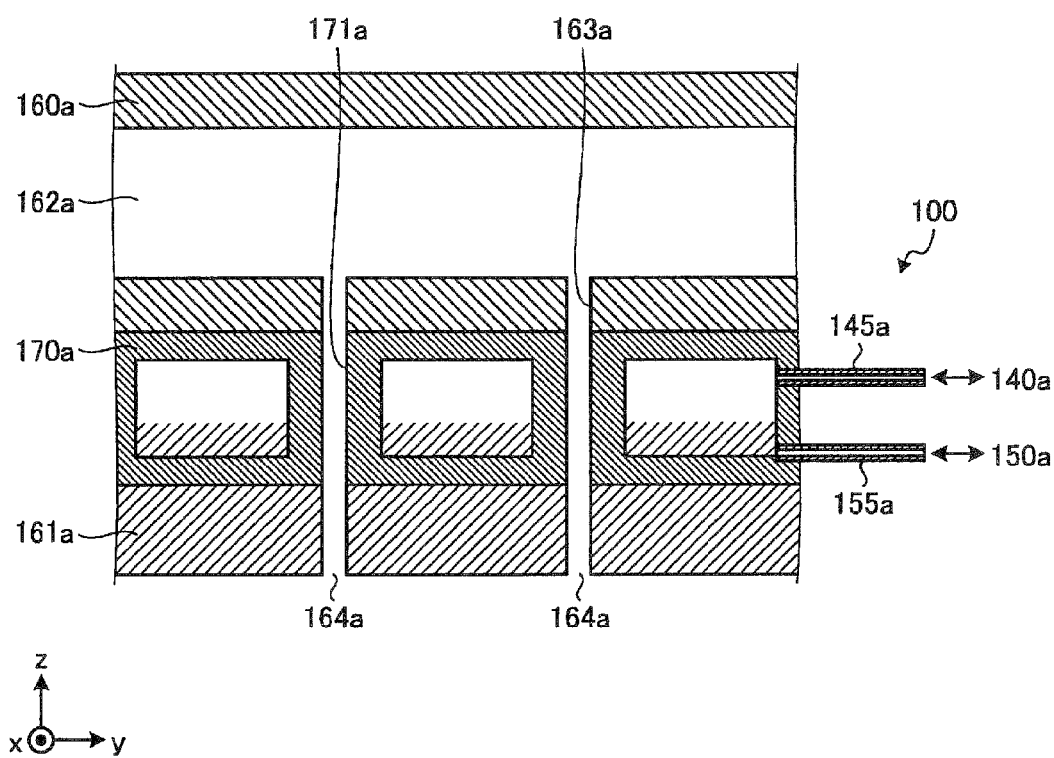
FIG. 27 is an enlarged cross-sectional view illustrating an example of a distribution adjusting unit in the tenth exemplary embodiment.
Figure 28:
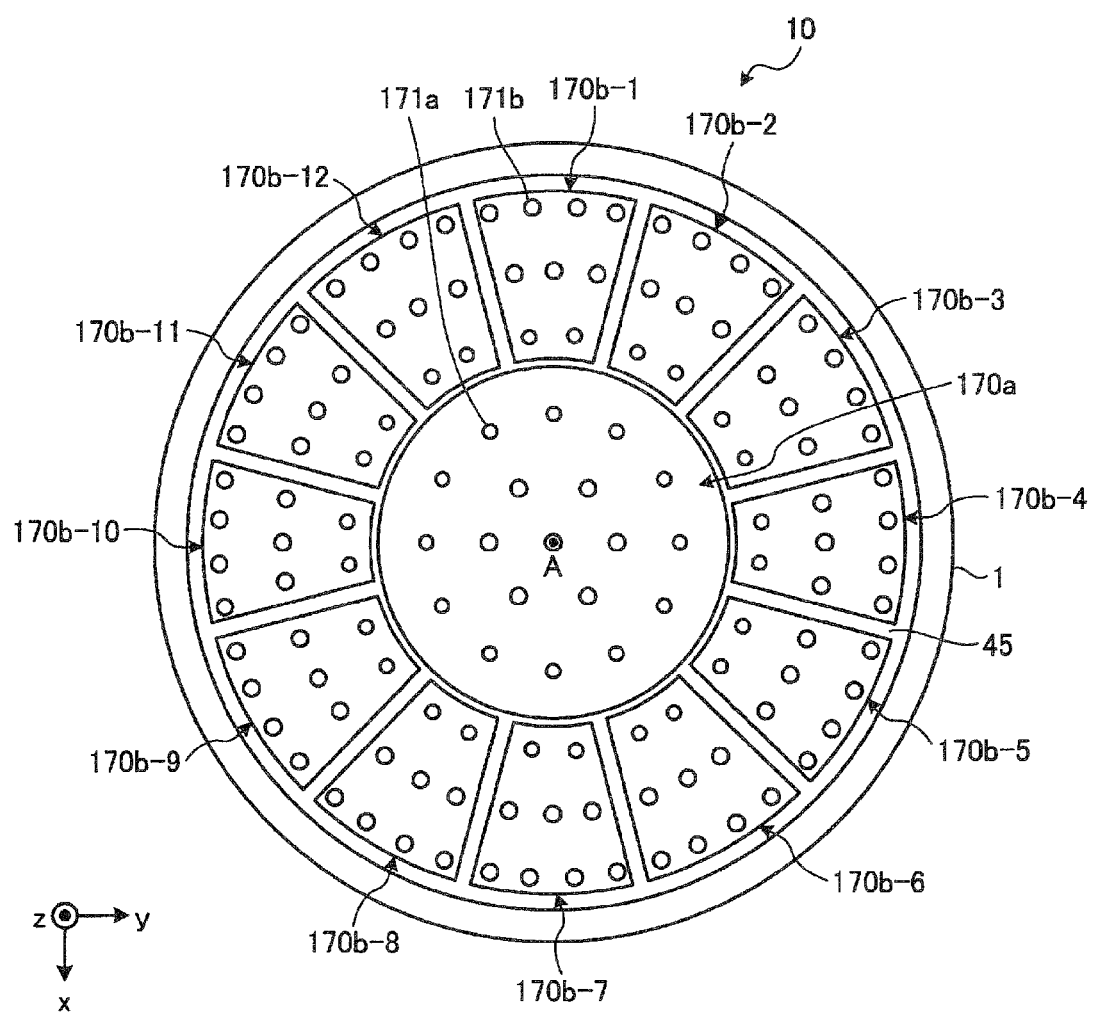
FIG. 28 is a top view illustrating an example of arrangement of containers.
Figure 29:
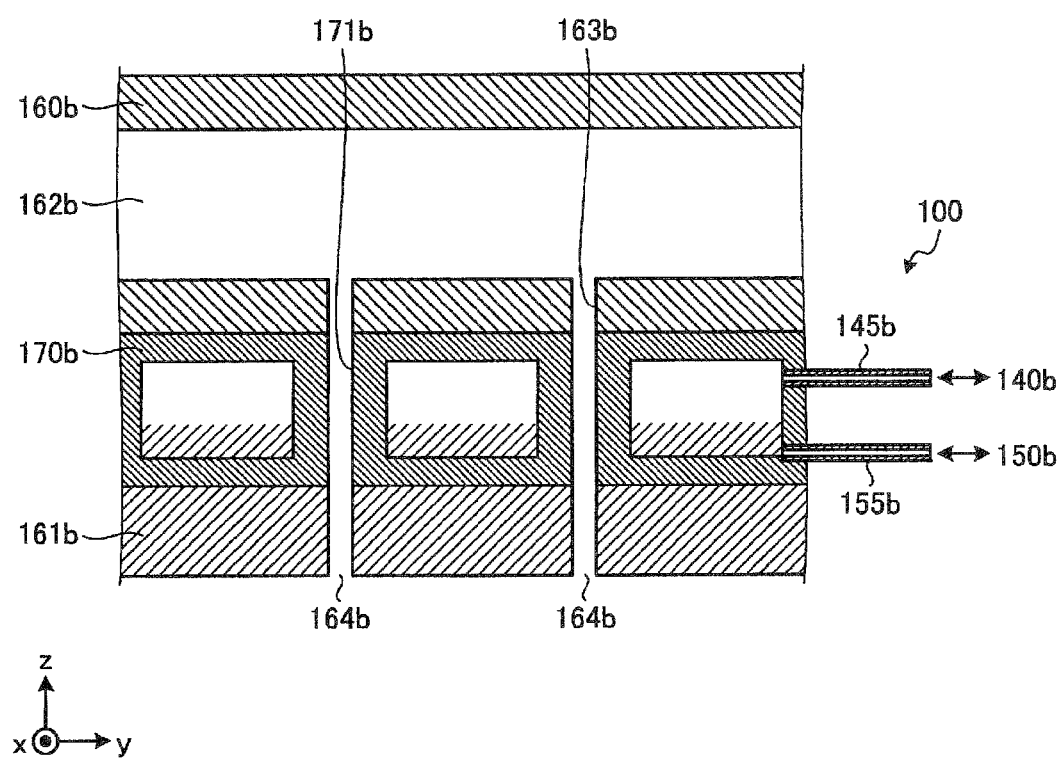
FIG. 29 is an enlarged cross-sectional view illustrating another example of the distribution adjusting unit in the tenth exemplary embodiment.

FIG. 26 is a cross-sectional view illustrating an example of a plasma processing apparatus 10 in the tenth exemplary embodiment. FIGS. 27 and 29 are enlarged cross-sectional views each illustrating an exemplary distribution adjusting unit 100 in the tenth exemplary embodiment. FIG. 28 is a top view illustrating an example of arrangement of containers 170. The plasma processing apparatus 10 according to the present exemplary embodiment is the same as the plasma processing apparatus 10 of the first exemplary embodiment described with reference to FIG. 1, except for the points to be described below. Thus, overlapping descriptions will be omitted.

The upper electrode 16 in the present exemplary embodiment is divided into an upper electrode 16a and a plurality of upper electrodes 16b around the upper electrode 16a. The plurality of upper electrodes 16b are arranged around the upper electrode 16a at substantially equal intervals in a circumferential shape around the axis A. The upper electrode 16a and the plurality of upper electrodes 16b are insulated by an insulating member 45. Further, the adjacent upper electrodes 16b are insulated from each other by an insulating member 45.

The upper electrode 16a is supported in the upper portion of the chamber 1 via the insulating member 45 and the peripheral upper electrodes 16b. The upper electrode 16a includes a top plate supporting portion 160a, a container 170a, and an upper top plate 161a. The top plate supporting portion 160a is formed of, for example, aluminum of which the surface is anodized in a substantially disc shape. The container 170a is formed of a hollow dielectric having a cavity (e.g., a hollow ceramic) in a substantially disc shape, and detachably supports the upper top plate 161a in its lower portion. The upper top plate 161a is formed of, for example, a silicon-containing material (e.g., Si, SiC, or quartz) in a substantially disc shape.

The top plate supporting portion 160a is grounded. As another example, the top plate supporting part 160a may be grounded via an element such as, for example, a capacitor or an electric circuit. A gas diffusion chamber 162a is provided inside the top plate supporting portion 160a. A plurality of gas flow ports 163a are formed in the lower portion of the gas diffusion chamber 162a. The plurality of gas flow ports 163a are formed concentrically around the axis A at substantially uniform intervals under the gas diffusion chamber 162a.

For example, as illustrated in FIGS. 27 and 28, a plurality of gas flow ports 171a are formed in the container 170a. For example, as illustrated in FIG. 28, the plurality of gas flow ports 171a are concentrically arranged at substantially uniform intervals around the axis A. For example, as illustrated in FIGS. 26 and 27, a gas adjusting unit 140a is connected to the space inside the container 170a via a pipe 145a, and a liquid adjusting unit 150a is connected thereto via a pipe 155a. The container 170a is an example of the dielectric unit.

For example, as illustrated in FIG. 26, the gas adjusting unit 140a includes a valve 141, a valve 142, a gas supply unit 143, and a gas suction unit 144. When a gas is supplied into the container 170a, the valve 142 is controlled to be in a closed state, and the valve 141 is controlled to be in an open state. Then, the gas is supplied from the gas supply unit 143 into the container 170a via the pipe 145a. Further, when a gas is sucked from the container 170a, the valve 141 is controlled to be in a closed state, and the valve 142 is controlled to be in an open state. Then, the gas in the container 170a is sucked by the gas suction unit 144 via the pipe 145a.

For example, as illustrated in FIG. 26, the liquid adjusting unit 150a includes a valve 151, a valve 152, a liquid supply unit 153, and a liquid suction unit 154. When a liquid is supplied into the container 170a, the valve 152 is controlled to be in a closed state, and the valve 151 is controlled to be in an open state. Then, the liquid is supplied from the liquid supply unit 153 into the container 170a via the pipe 155a. Further, when a liquid is sucked from the container 170a, the valve 151 is controlled to be in a closed state, and the valve 152 is controlled to be in an open state. Then, the liquid in the container 170a is sucked by the liquid suction unit 154 via the pipe 155a.

In the upper top plate 161a, a plurality of gas flow ports 164a are concentrically formed around the axis A at substantially uniform intervals. For example, as illustrated in FIG. 27, each of the gas flow ports 164a communicates with the gas flow port 171a of the container 170a. The top plate supporting portion 160a is provided with a gas introduction port 165a that introduces a processing gas into the gas diffusion chamber 162a. One end of the pipe 15b is connected to the gas supply source 15 via the valve V and the MFC 15a, and the other end branches into a plurality of pipes, one of which is connected to the gas introduction port 165a. The processing gas supplied from the gas supply source 15 is supplied into the gas diffusion chamber 162a via the pipe 15b and the gas introduction port 165a, and diffused in a shower form and supplied into the chamber 1 via the gas flow ports 163a, the gas flow ports 171a, and the gas flow ports 164a.

Further, each of the upper electrodes 16b is supported in the upper portion of the chamber 1 via the insulating member 45. Each of the upper electrodes 16b has a top plate supporting portion 160b, a plurality of containers 170b-1 to 171b-12, and an upper top plate 161b. The top plate supporting portion 160b is formed of, for example, aluminum of which the surface is anodized. Each of the containers 170b is formed of a hollow dielectric having a cavity (e.g., a hollow ceramic) in a substantially disc shape, and detachably supports the upper top plate 161b in its lower portion. The upper top plate 161b is formed of, for example, a silicon-containing material such as, for example, Si, SiC, or quartz.

Each of the top plate supporting portions 160b is grounded. As another example, each of the top plate supporting parts 160b may be grounded via an element such as, for example, a capacitor or an electric circuit. A gas diffusion chamber 162a is provided inside each of the top plate supporting portions 160b. A plurality of gas flow ports 163b are formed in the gas diffusion chamber 162b. The plurality of gas flow ports 163b are formed in the lower portion of the gas diffusion chamber 162b at substantially uniform intervals along the circumference of concentric circles around the axis A.

For example, as illustrated in FIGS. 28 and 29, a plurality of gas flow ports 171b are formed in each of the containers 170b. For example, as illustrated in FIG. 28, the plurality of gas flow ports 171b are arranged at substantially uniform intervals along concentric circles around the axis A. For example, as illustrated in FIGS. 26 and 29, a gas adjusting unit 140b is connected to the space inside each of the containers 170b via a pipe 145b, and a liquid adjusting unit 150b is connected thereto via a pipe 155b. Each of the containers 170b is an example of the dielectric unit. The gas adjusting unit 140b and the liquid adjusting unit 150b connected to each of the containers 170b independently adjust the ratio of the gas and the liquid in each of the containers 170b. Hereinafter, descriptions will be made on the structure of one container 170b among the plurality of containers 170b-1 to 170b-12 and the structure of the gas adjusting unit 140b and the liquid adjusting unit 150b connected thereto. However, the same also applies to the structures of the other containers 170b and the gas adjusting units 140b and the liquid adjusting unit 150b connected thereto.

The gas adjusting unit 140b has the same configuration as the gas adjusting unit 140a illustrated in, for example, FIG. 26. Specifically, the gas adjusting unit 140a includes a valve 141, a valve 142, a gas supply unit 143, and a gas suction unit 144. When a gas is supplied into the container 170b, the valve 142 is controlled to be in a closed state, and the valve 141 is controlled to be in an open state. Then, the gas is supplied from the gas supply unit 143 into the container 170b via the pipe 145b. Further, when a gas is sucked from the container 170b, the valve 141 is controlled to be in a closed state, and the valve 142 is controlled to be in an open state. Then, the gas in the container 170b is sucked by the gas suction unit 144 via the pipe 145b.

The liquid adjusting unit 150b has the same configuration as the liquid adjusting unit 140b illustrated in, for example, FIG. 26. Specifically, the liquid adjusting unit 140a includes a valve 151, a valve 152, a liquid supply unit 153, and a liquid suction unit 154. When a liquid is supplied into the container 170b, the valve 152 is controlled to be in a closed state, and the valve 151 is controlled to be in an open state. Then, the liquid is supplied from the liquid supply unit 153 into the container 170b via the pipe 155b. Further, when a liquid is sucked from the container 170b, the valve 151 is controlled to be in a closed state, and the valve 152 is controlled to be in an open state. Then, the liquid in the container 170b is sucked by the liquid suction unit 154 via the pipe 155b.

In the present exemplary embodiment, the gas supplied into the container 170a and the container 170b is, for example, dry air, and the liquid supplied into the container 170a and the container 170b is, for example, an organic solvent (e.g., Galden). The operation of the supply and suction of the gas by the gas adjusting unit 140a and the gas adjusting unit 140b and the operation of the supply and suction of the liquid by the liquid adjusting unit 150a and the liquid adjusting unit 150b are controlled by the controller 60. In the present exemplary embodiment, the supply and suction of the gas in the container 170a are performed by the gas adjusting unit 140a, and the supply and suction of the gas in the corresponding container 170b is performed by each gas adjusting unit 140b. However, the present disclosure is not limited thereto. For example, the other end of the pipe 145a connected to the container 170a may be opened to the atmosphere, and only the amount of the liquid in the container 170a may be adjusted by the liquid adjusting unit 150a. Similarly, for example, the other end of the pipe 145b connected to each of the container 170b may be opened to the atmosphere, and only the amount of the liquid in the corresponding container 170b may be adjusted by each of the liquid adjusting unit 150b. Even in this case, it is possible to adjust the ratio of the liquid and the gas in the container 170a and the container 170b according to the amount of the liquid supplied into the container 170a and the container 170b.

In each of the upper top plates 161b, a plurality of gas flow ports 164b are concentrically formed around the axis A at substantially uniform intervals. For example, as illustrated in FIG. 29, each of the gas flow ports 164b communicates with the gas flow port 171b of the container 170b. The top plate supporting portion 160b is provided with a gas introduction port 165b that introduces a processing gas into the gas diffusion chamber 162b. The other end of the pipe 15b branches into a plurality of pipes, one of which is connected to the gas introduction port 165b. The processing gas supplied from the gas supply source 15 is supplied into the gas diffusion chamber 162b via the pipe 15b and the gas introduction port 165b, and diffused in a shower form and supplied into the chamber 1 via the gas flow ports 163b, the gas flow ports 171b, and the gas flow ports 164b.

In the tenth exemplary embodiment, the high frequency power for plasma generation, which is generated by the high frequency power supply 7a, is applied to the lower electrode 2a via the matching unit 8a. In the tenth exemplary embodiment, the lower electrode 2a functions as a cathode to which a high frequency power for plasma generation is applied. Meanwhile, each of the upper electrode 16a and the plurality of upper electrodes 16b functions as an anode which is a counter electrode to the lower electrode 2a with respect to the high frequency power for plasma generation. In the present exemplary embodiment, the lower electrode 2a is an example of the first electrode, and the upper electrode 16a and the plurality of upper electrodes 16b are an example of the second electrode. In addition, the upper electrode 16a is an example of the central portion of the second electrode, and the plurality of upper electrodes 16b is an example of the peripheral portion disposed around the upper electrode 16a.

Also in the present exemplary embodiment, the dielectric constant of the entire substance applied into the container 170 may be changed individually by controlling the ratio of the fluids having different dielectric constants supplied into the container 170b in the upper electrode 16a and the respective containers 170b included in the plurality of upper electrodes 16b. Thus, the impedance between the plasma in the processing space S and each of the upper electrode 16a and the plurality of upper electrodes 16b may be individually changed. Therefore, the uniformity of the plasma generated in the plasma processing apparatus 10 may be improved, and the uniformity of the processing on the semiconductor wafer W may be improved.

<Others>

The present disclosure is not limited to the above-described exemplary embodiments, and various modifications may be made within the scope of the disclosure.

For example, in the first to fifth exemplary embodiments described above, the actuators 102 of each distribution adjusting unit 100 move the dielectric units 101 in the vertical direction. However, in another example, the actuators 102 may move the dielectric units 101 to the axis A in a radial direction of a circle around the axis A or in a circumferential direction of a circle around the axis A.

Further, it is possible to combine the first to fifth exemplary embodiments and the sixth exemplary embodiment, change the positions of the respective dielectric units 101, and change the dielectric constants of the dielectric units 101.

In the first to fifth exemplary embodiments described above, the plurality of dielectric units 101 are arranged in two rows along the circumference around the axis A. However, the present disclosure is not limited thereto. For example, the plurality of dielectric units 101 may be arranged in one row or in three or more rows along the circumference around the axis A. Similarly for the sixth exemplary embodiment, the plurality of dielectric units 101 may be arranged in two or more rows along the circumference around the axis A. Similarly for the tenth exemplary embodiment, the plurality of upper electrodes 16b may be arranged in two or more rows along the circumference around the axis A.

Further, in the seventh to tenth exemplary embodiments described above, dry air and an organic solvent were described as examples of a plurality of kinds of fluids having different dielectric constants. However, in the case of a plurality of types of fluids having different dielectric constants, the combination of fluids is not limited to gas and liquid, but may be two kinds of gases having different dielectric constants, or may be two types of liquids having different dielectric constants. Further, three or more kinds of fluids may be used as long as they are a plurality of kinds of fluids having different dielectric constants.

Further, in the seventh to tenth exemplary embodiments described above, the dielectric constant of each container is changed by changing the ratio of a plurality of fluids having different dielectric constants filled in each container, but the present disclosure is not limited thereto. For example, a heater may be provided in each container to change the temperature of the fluid in the container, thereby changing the dielectric constant of the container filled with the fluid. In this case, as the fluid filled in the container, one kind of fluid or a plurality of kinds of fluids having different dielectric constants may be used. In the case of using a plurality of kinds of fluids having different dielectric constants, the amount of change in the dielectric constant in each container may be increased by controlling the ratio of the fluids filled in the container and the temperature in the container.

Further, in the above-described exemplary embodiments, a capacitively coupled parallel plate plasma etching apparatus has been described as an example of the plasma processing apparatus 10, but the present disclosure is not limited thereto. The present disclosure may also be applied to an etching apparatus using another method such as, for example, inductively coupled plasma (ICP) as long as the apparatus performs a predetermined processing on the semiconductor wafer W using plasma. Further, in addition to the etching apparatus, the present disclosure may also be applied to an apparatus that performs a processing such as film formation and reforming as long as the apparatus performs a predetermined processing on the semiconductor wafer W using plasma.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A plasma processing apparatus comprising:
   a processing chamber;
   a first electrode provided in the processing chamber and configured to be supplied with a high frequency power;
   a second electrode configured to function as a counter electrode with respect to the first electrode;
   a plurality of dielectric units arranged between plasma generated between the first electrode and the second electrode, and the second electrode;
   a controller configured to control an impedance between the plasma and the second electrode via each of the dielectric units by independently controlling a position of each of the dielectric units;
   a first insulator configured to support the second electrode;
   a second insulator surrounding the plurality of dielectric units; and
   a plurality of actuators configured to move the plurality of dielectric units according to an instruction from the controller,
   wherein among the plurality of dielectric units, at least two dielectric units are each disposed at a different distance from the second electrode and are inserted into a space defined by the processing chamber, the first insulator, the second insulator and at least two actuators that move the at least two dielectric units.

2. The plasma processing apparatus of claim 1, wherein the controller is configured to control the impedance between the plasma and the second electrode via each of the dielectric units by controlling a position of each of the dielectric units in a direction perpendicular to an electrode surface of the first electrode that faces the second electrode and/or a position of each of the dielectric units in a direction parallel to the electrode surface.

3. The plasma processing apparatus of claim 1, wherein each of the dielectric units is an at least partially plate-like dielectric, and is arranged in a peripheral portion of the second electrode in a direction in which a thickness direction of the dielectric unit is an in-plane direction of an electrode surface of the first electrode that faces the second electrode.

4. The plasma processing apparatus of claim 1, wherein each of the dielectric units is an at least partially rod-like dielectric, and is arranged in a peripheral portion of the second electrode in a direction in which a longitudinal direction of the dielectric unit is a direction perpendicular to an electrode surface of the first electrode that faces the second electrode.

5. The plasma processing apparatus of claim 1, wherein the controller is configured to control the dielectric constant of each of the dielectric units by controlling a temperature of each of the dielectric units.

6. The plasma processing apparatus of claim 1, wherein each of the dielectric units includes a container to which at least one of a plurality of kinds of fluids having different dielectric constants is supplied, and
   the controller is configured to control the dielectric constant of each of the dielectric units by controlling a ratio of the plurality of kinds of fluids supplied into the container of each of the dielectric units.

7. The plasma processing apparatus of claim 1, wherein the dielectric units are arranged in a central portion and a peripheral portion of the second electrode, and
   the controller is configured to independently control the dielectric constant of each of the dielectric units.

8. The plasma processing apparatus of claim 3, wherein each of the dielectric units includes a support portion and a plate portion, and
   the dielectric units are arranged such that the plate portions overlaps each other in a vertical direction.

9. The plasma processing apparatus of claim 8, wherein the plate portions overlap each other in the vertical direction such that gaps between upper plate portions adjacent in a circumferential direction and gaps between lower plate portions adjacent in the circumferential direction are defined at different positions in the circumferential direction.

10. The plasma processing apparatus of claim 3, wherein each of the dielectric units includes a support portion and a plate portion, and
    the plate portions of the dielectric units are arranged such that the thickness direction thereof is directed in a vertical direction.

11. The plasma processing apparatus of claim 6, wherein each of the dielectric units includes a plurality of containers to which a plurality of kinds of fluids having different dielectric constants are independently supplied, and
    the controller is configured to independently control the dielectric constants of each of the dielectric units.

12. The plasma processing apparatus of claim 1, wherein each of the dielectric units includes a container to which at least one of a plurality of kinds of fluids having different dielectric constants is supplied, and a heater provided in the container, and
    the controller is configured to control the dielectric constants of each of the dielectric units by independently controlling a ratio of the plurality of kinds of fluids supplied into the container of each of the dielectric units and a temperature in the container of each of the dielectric units.

13. The plasma processing apparatus of claim 1, wherein the at least two dielectric units are inserted into the space via a through-hole of the first insulator.

* * * * *